United States Patent
Nishinouchi et al.

(10) Patent No.: US 12,143,100 B2
(45) Date of Patent: Nov. 12, 2024

(54) SIGNAL TRANSMISSION DEVICE, ELECTRONIC DEVICE, AND VEHICLE

(71) Applicant: ROHM CO., LTD., Kyoto (JP)

(72) Inventors: Masato Nishinouchi, Kyoto (JP); Akio Sasabe, Kyoto (JP); Takeshi Kikuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 19 days.

(21) Appl. No.: 18/250,035

(22) PCT Filed: Oct. 21, 2021

(86) PCT No.: PCT/JP2021/038884
§ 371 (c)(1),
(2) Date: Apr. 21, 2023

(87) PCT Pub. No.: WO2022/091922
PCT Pub. Date: May 5, 2022

(65) Prior Publication Data
US 2024/0007100 A1   Jan. 4, 2024

(30) Foreign Application Priority Data
Oct. 28, 2020   (JP) .................. 2020-180323

(51) Int. Cl.
| G05F 1/66 | (2006.01) |
| H01G 4/30 | (2006.01) |
| H03K 5/24 | (2006.01) |
| H03K 17/56 | (2006.01) |

(52) U.S. Cl.
CPC ............ H03K 17/56 (2013.01); H01G 4/30 (2013.01); H03K 5/24 (2013.01)

(58) Field of Classification Search
CPC ................................ H03K 17/56; H03K 5/24
See application file for complete search history.

(56) References Cited

U.S. PATENT DOCUMENTS

| 6,069,050 | A | 5/2000 | Hou et al. |
| 2004/0012911 | A1 | 1/2004 | Lee et al. |
| 2004/0232922 | A1 | 11/2004 | Eberlein |
| 2009/0230938 | A1* | 9/2009 | Sakurai ................. H02M 7/538 |
| | | | 323/283 |
| 2012/0211868 | A1 | 8/2012 | Stribley et al. |

(Continued)

FOREIGN PATENT DOCUMENTS

| EP | 2579470 A2 | 4/2013 |
| JP | 2018011108 | 1/2018 |

OTHER PUBLICATIONS

International Search Report for PCT/JP2021/038884 dated Jan. 11, 2022, with English translation (5 pages).

(Continued)

*Primary Examiner* — Jared Fureman
*Assistant Examiner* — Esayas G Yeshaw
(74) *Attorney, Agent, or Firm* — Fish & Richardson P.C.

(57) ABSTRACT

A signal transmission device includes a capacitor having a first capacitor element and a second capacitor element connected in parallel such that electrodes of different polarities are connected together between them, and transmits an analog signal in a form converted into a pulse signal by use of a triangular-wave signal generated through charging and discharging of the capacitor.

11 Claims, 27 Drawing Sheets

(56) References Cited

U.S. PATENT DOCUMENTS

| | | |
|---|---|---|
| 2012/0250385 A1 | 10/2012 | Takihara et al. |
| 2012/0287689 A1* | 11/2012 | Fitzgerald ......... H02M 3/33592 |
| | | 363/125 |
| 2013/0009674 A1 | 1/2013 | Reese et al. |
| 2016/0079139 A1 | 3/2016 | Kaeriyama |
| 2020/0091768 A1* | 3/2020 | Smith .................... H02J 50/80 |
| 2023/0101061 A1* | 3/2023 | Fabbro ................ H03K 17/689 |
| | | 361/115 |

OTHER PUBLICATIONS

German Patent and Trademark Office, Office Action in German Appln. No. 112021004682.9, mailed on Apr. 9, 2024, 14 pages (with English translation).

* cited by examiner

SIGNAL TRANSMISSION DEVICE, ELECTRONIC DEVICE, AND VEHICLE

CROSS REFERENCE OF RELATED APPLICATIONS

This application is a U.S. National Phase application under 35 U.S.C. § 371 of International Patent Application No. PCT/JP2021/038884, filed on Oct. 21, 2021, which claims the priority of Japanese Patent Application No. JP2020-180323, filed on Oct. 28, 2020, the disclosure of which is incorporated herein by reference in its entirety.

TECHNICAL FIELD

The invention disclosed herein relates to signal transmission devices, electronic devices, and vehicles.

BACKGROUND ART

Signal transmission devices are conventionally in practical use that have a function (signal transmission function) of transmitting an input pulse signal as an output pulse signal.

One example of the known technology related to what is mentioned above is seen in Patent Document 1 identified below.

CITATION LIST

Patent Literature

Patent Document 1: JP-A-2018-011108

SUMMARY OF INVENTION

Technical Problem

Some conventional signal transmission devices use a triangular-wave signal generated through charging and discharging of a capacitor to transmit an analog signal (e.g., a monitoring target signal conveying voltage information or temperature information) in a form converted into a pulse signal.

Inconveniently, depending on the voltage characteristics of the capacitor, the capacitance value may exhibit high dependence on voltage and affect the generation of the triangular-wave signal. In view of this, the conventional signal transmission devices leave room for further improvement for higher accuracy in generation of a triangular-wave signal (hence for higher accuracy in conversion into a pulse signal).

In view of the above-mentioned challenge encountered by the present inventors, an object of the invention disclosed herein is to provide a signal transmission device, an electronic device, and a vehicle that can transmit an analog signal in a form accurately converted into a pulse signal.

Solution to Problem

For example, according to what is disclosed herein, a signal transmission device includes a capacitor having a first capacitor element and a second capacitor element connected in parallel such that electrodes of different polarities are connected together therebetween, and transmits an analog signal in a form converted into a pulse signal by use of a triangular-wave signal generated through charging and discharging of the capacitor.

Advantageous Effects of Invention

According to the invention disclosed herein, it is possible to provide a signal transmission device, an electronic device, and a vehicle that can transmit an analog signal in a form accurately converted into a pulse signal.

DESCRIPTION OF EMBODIMENTS

<Signal Transmission Device (Basic Configuration)>

Figure 1:
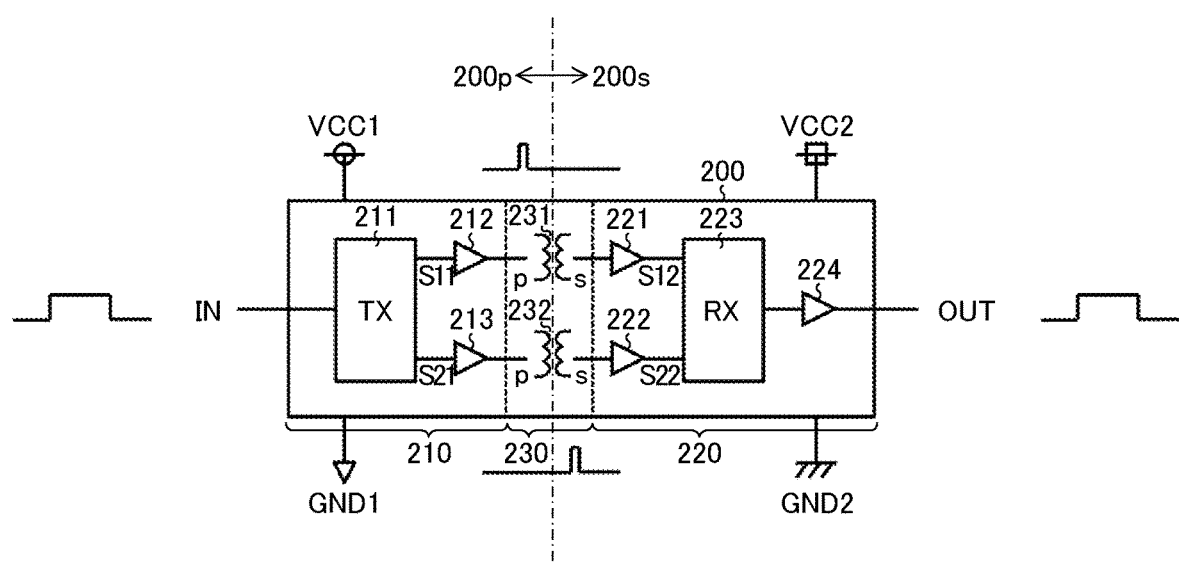
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200p (VCC1-GND1 system) and a secondary circuit system 200s (VCC2-GND2 system), transmits a pulse signal from the primary circuit system 200p to the secondary circuit system 200s to drive the gate of a switching device (unillustrated) provided in the secondary circuit system 200s. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231p, the reception pulse signal S12 from the secondary coil 231s. Likewise, the transformer 232 outputs, according to the transmission pulse signal S21 fed to the primary coil 232p, the reception pulse signal S22 from the secondary coil 232s.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200p to the secondary circuit system 200s.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
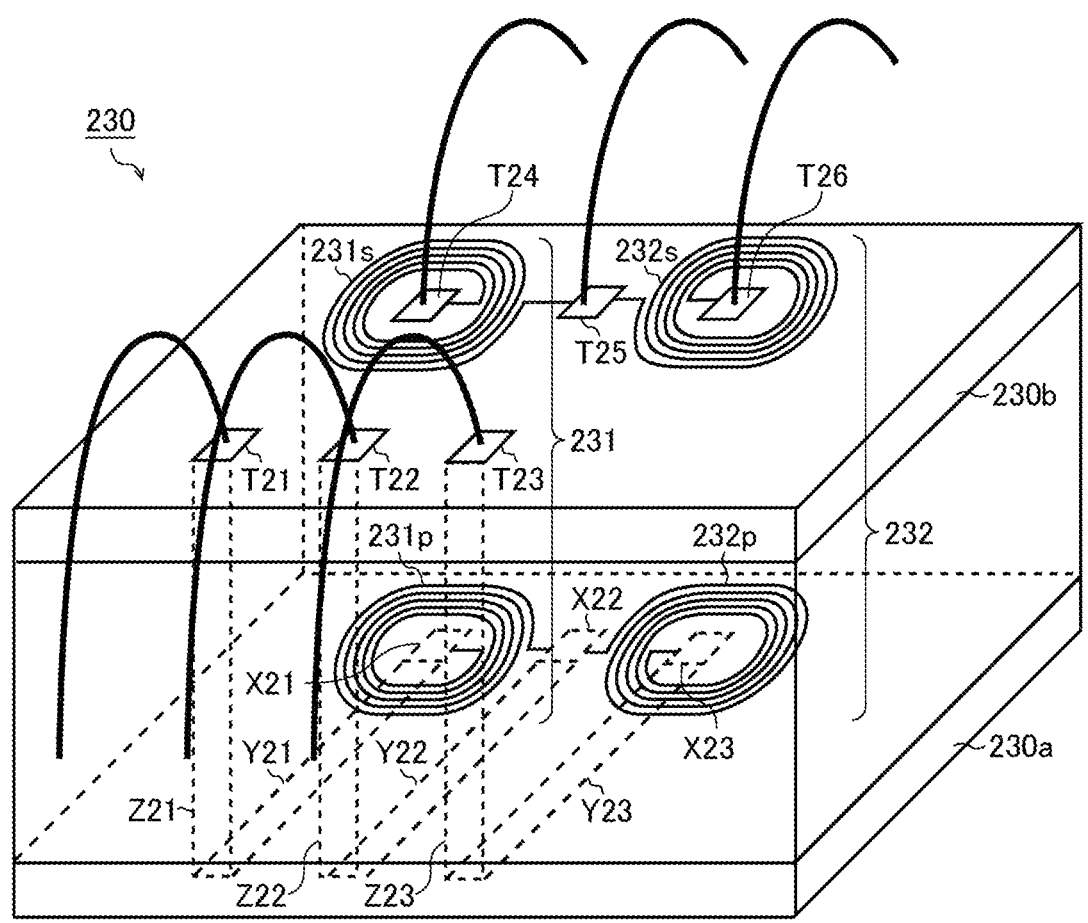
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231p and a secondary coil 231s that face each other in the up-down direction; the transformer 232 includes a primary coil 232p and a secondary coil 232s that face each other in the up-down direction.

The primary coils 231p and 232p are both formed in a first wiring layer (lower layer) 230a in the transformer chip 230. The secondary coils 231s and 231s are both formed in a second wiring layer (the upper layer in the diagram) 230b in the transformer chip 230. The secondary coil 231s is disposed right above the primary coil 231p and faces the primary coil 231p; the secondary coil 232s is disposed right above the primary coil 232p and faces the primary coil 232p.

The primary coil 231p is laid in a spiral shape so as to encircle an internal terminal X21 clockwise, starting at the first terminal of the primary coil 231p, which is connected to the internal terminal X21. The second terminal of the primary coil 231p, which corresponds to its end point, is connected to an internal terminal X22. Likewise, the primary coil 232p is laid in a spiral shape so as to encircle an internal terminal X23 anticlockwise, starting at the first terminal of the primary coil 232p, which is connected to the internal terminal X23. The second terminal of the primary coil 232p, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232s, which is connected to the external terminal T26. The second terminal of the secondary coil 232s, which corresponds to its end point, is connected to the external terminal T25. The external terminals T24, T25, and T26 are disposed in a straight row in the illustrated order and are used for wire-bonding with the driver chip 220.

The secondary coils 231s and 232s are AC-connected to the primary coils 231p and 232p, respectively, by magnetic coupling, and are DC-isolated from the primary coils 231p and 232p. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
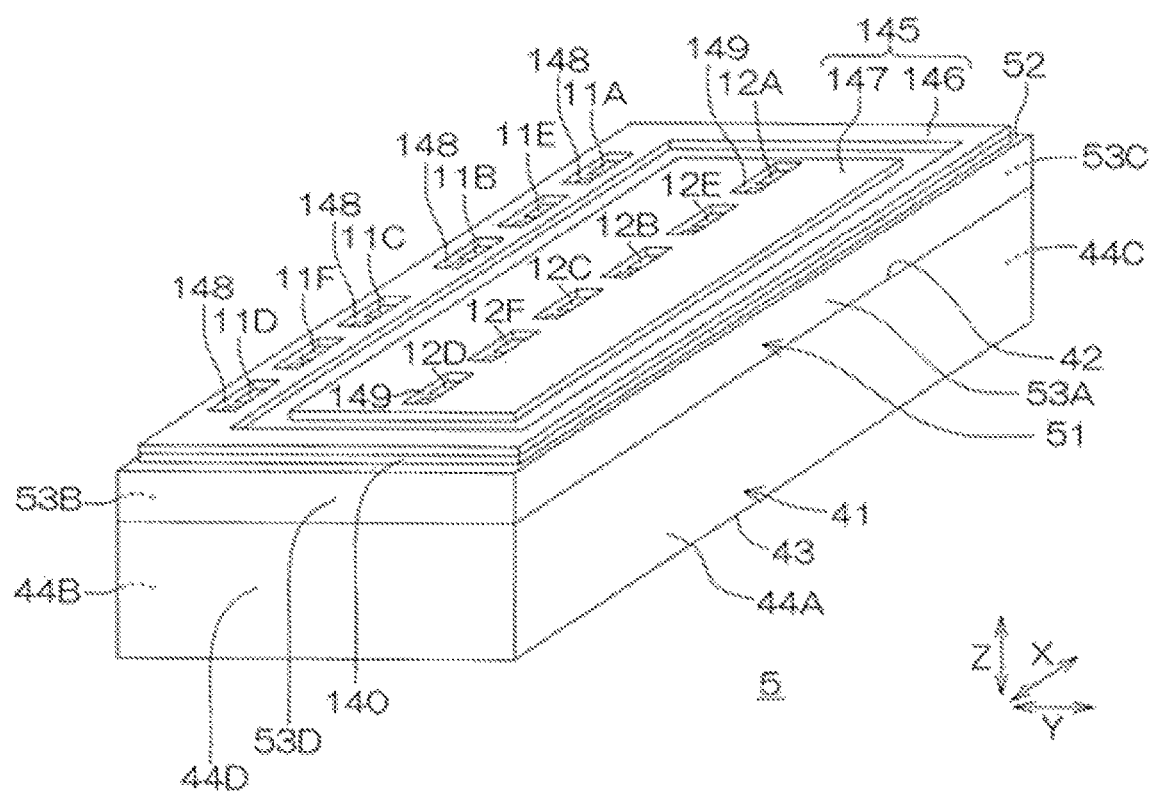
FIG. 3 a perspective view of a semiconductor device used as a two-channel transformer chip.
Figure 4:
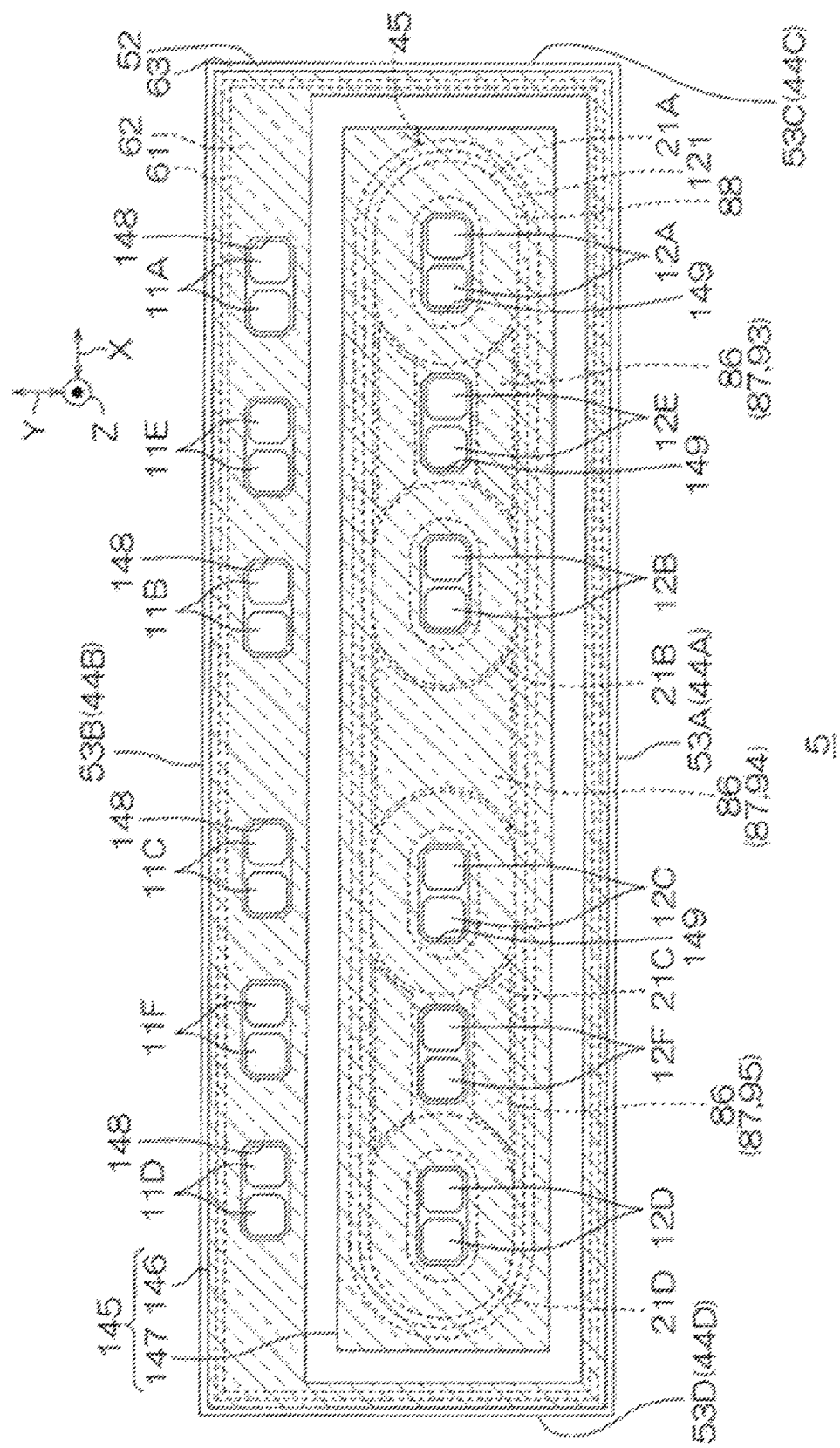
FIG. 4 is a plan view of the semiconductor device shown in FIG. 3.
Figure 5:
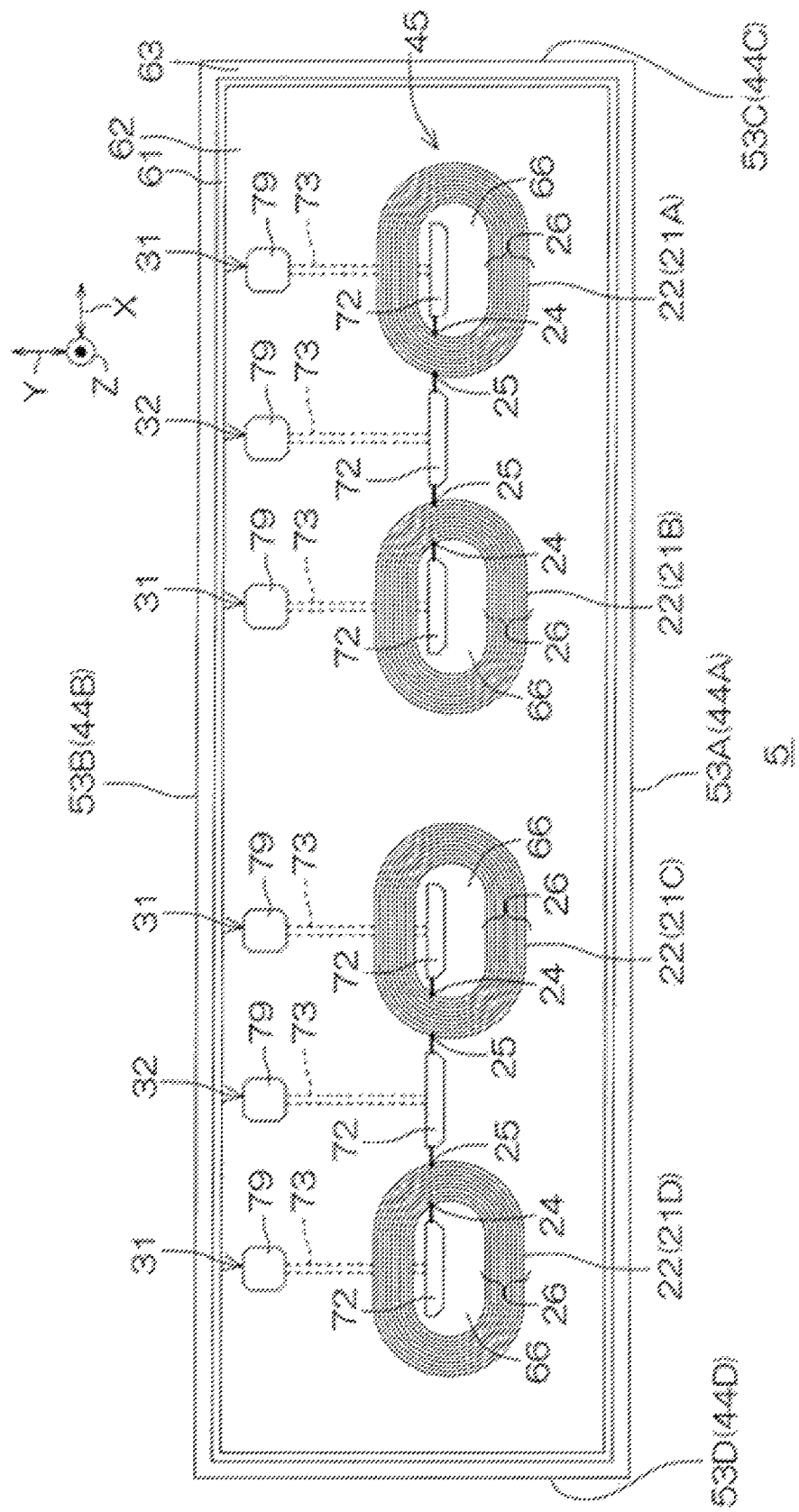
FIG. 5 is a plan view of a layer in the semiconductor device shown in FIG. 3 where low-potential coils are formed.
Figure 6:
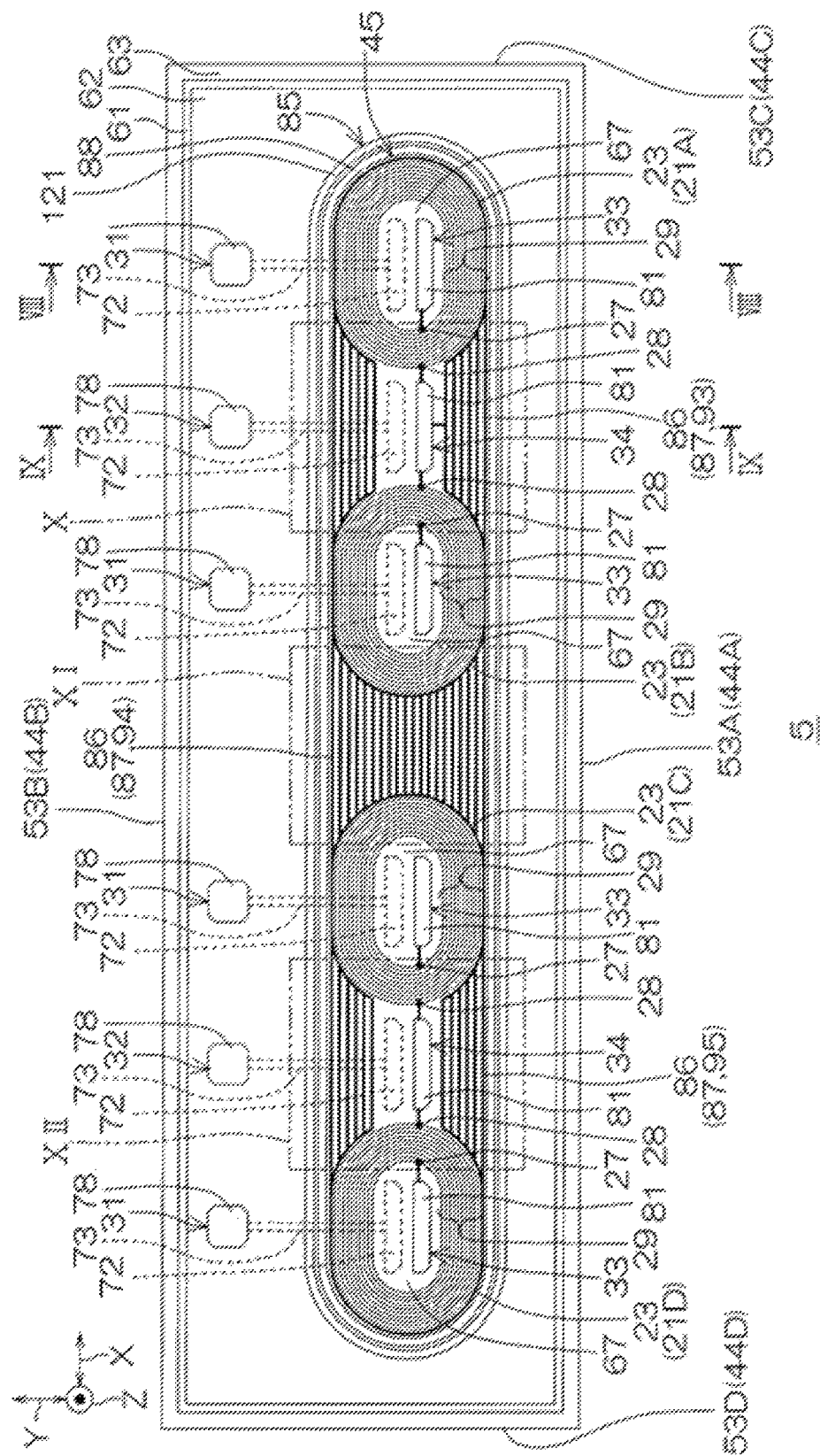
FIG. 6 is a plan view of a layer in the semiconductor device shown in FIG. 3 where high-potential coils are formed.
Figure 7:
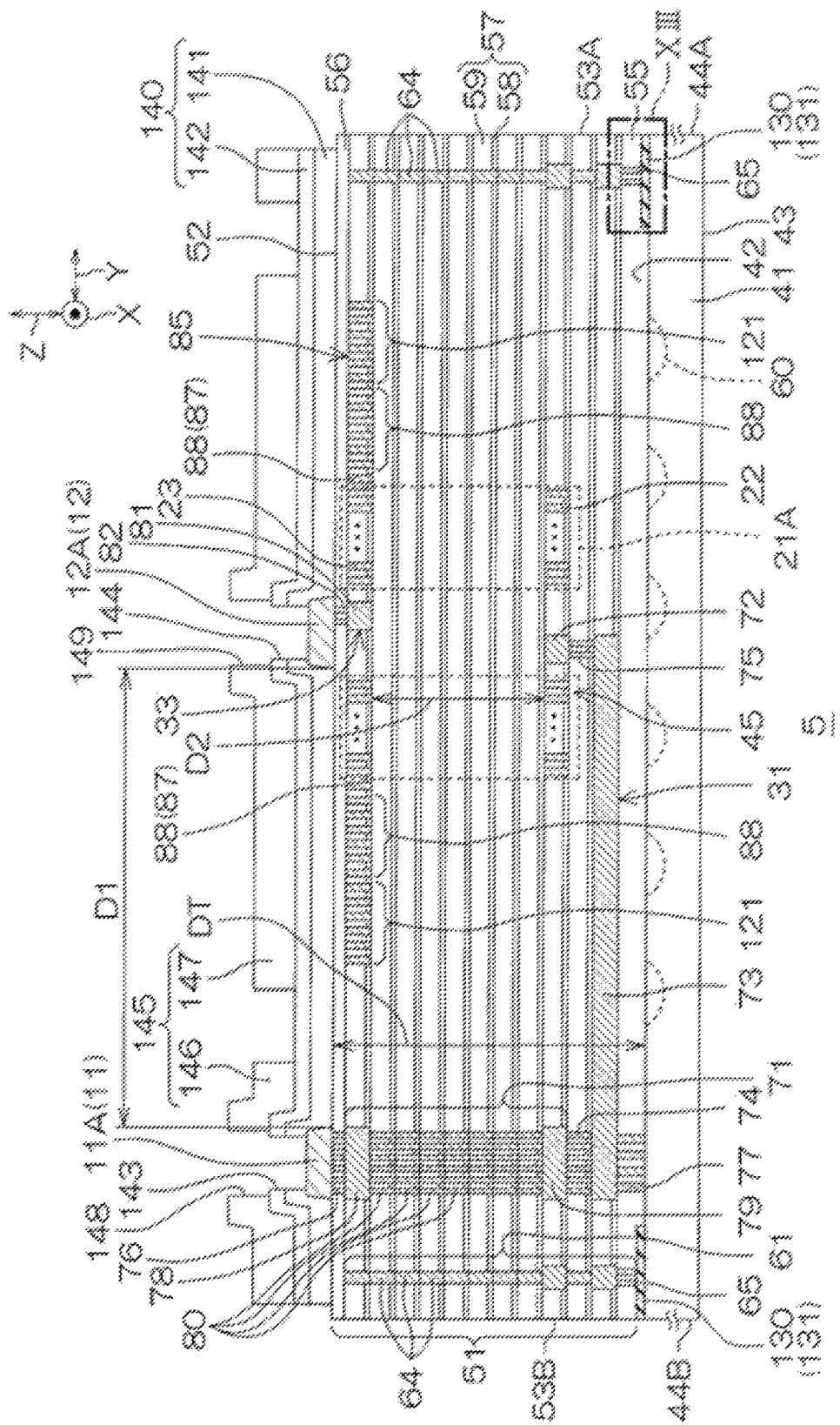
FIG. 7 is a cross-sectional view taken along line VIII-VIII shown in FIG. 6.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multi-layer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 μm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but m or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 µm or more but 500 µm or less. The distance D2 can be 1 µm or more but 50 µm or less. Preferably, the distance D2 is 5 µm or more but 25 µm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Figure 8:
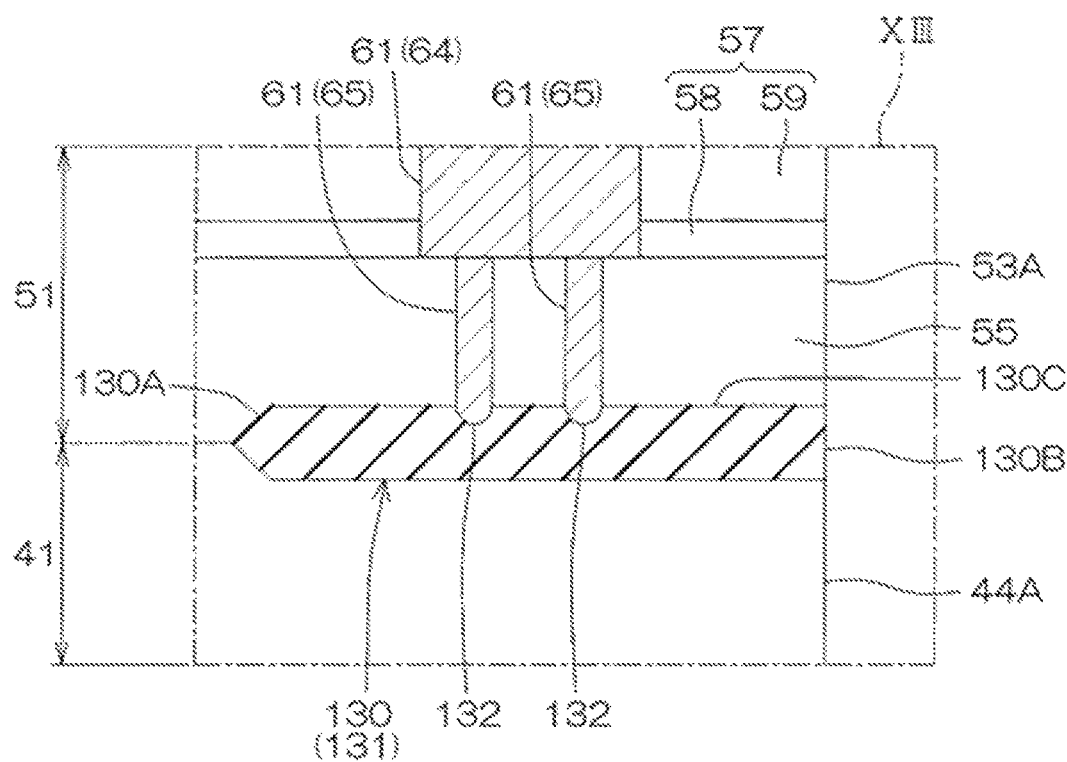
FIG. 8 is an enlarged view (showing a separation structure) of region XIII shown in FIG. 7.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 m or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present invention can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
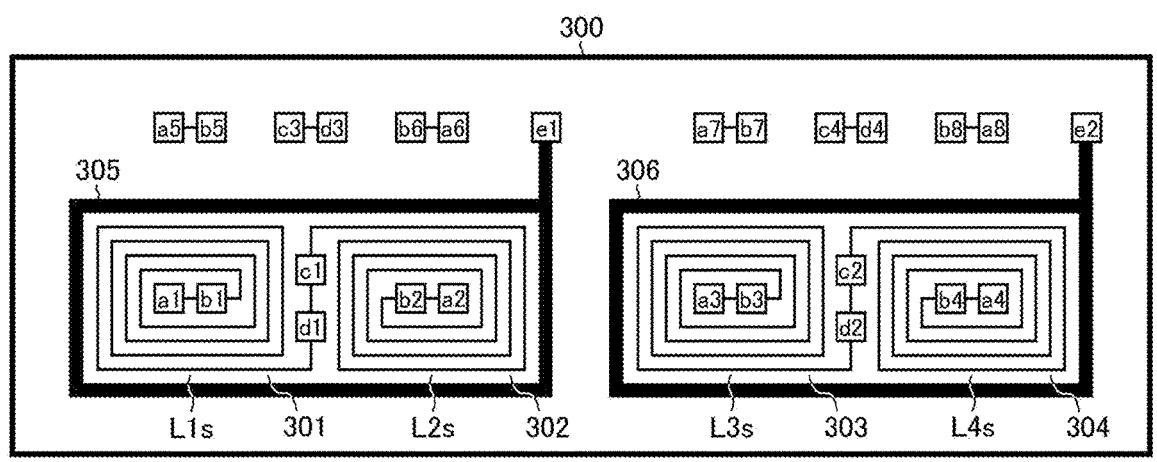
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil Lis of the first transformer 301, and the pads c1 and d1 are connected to the other terminal of that secondary coil L1s. The pads a2 and b2 are connected to one terminal of the secondary coil L2s of the second transformer 302, and the pads c1 and d1 are connected to the other terminal of that secondary coil L2s.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 9 does not show any of the primary coils of the first, second, third, and fourth transformers 301, 302, 303, and 304. The primary coils basically have structures similar to those of the secondary coils L1s to L4s respectively, and are disposed right below the secondary coils L1s to L4s, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1s and L2s. The pads c2 and d2 are shared between the secondary coils L3s and L4s. The pads c3 and d3 are shared between the primary coils Lip and L2p. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

<Signal Transmission Device (Basic Configuration)>

Figure 10:
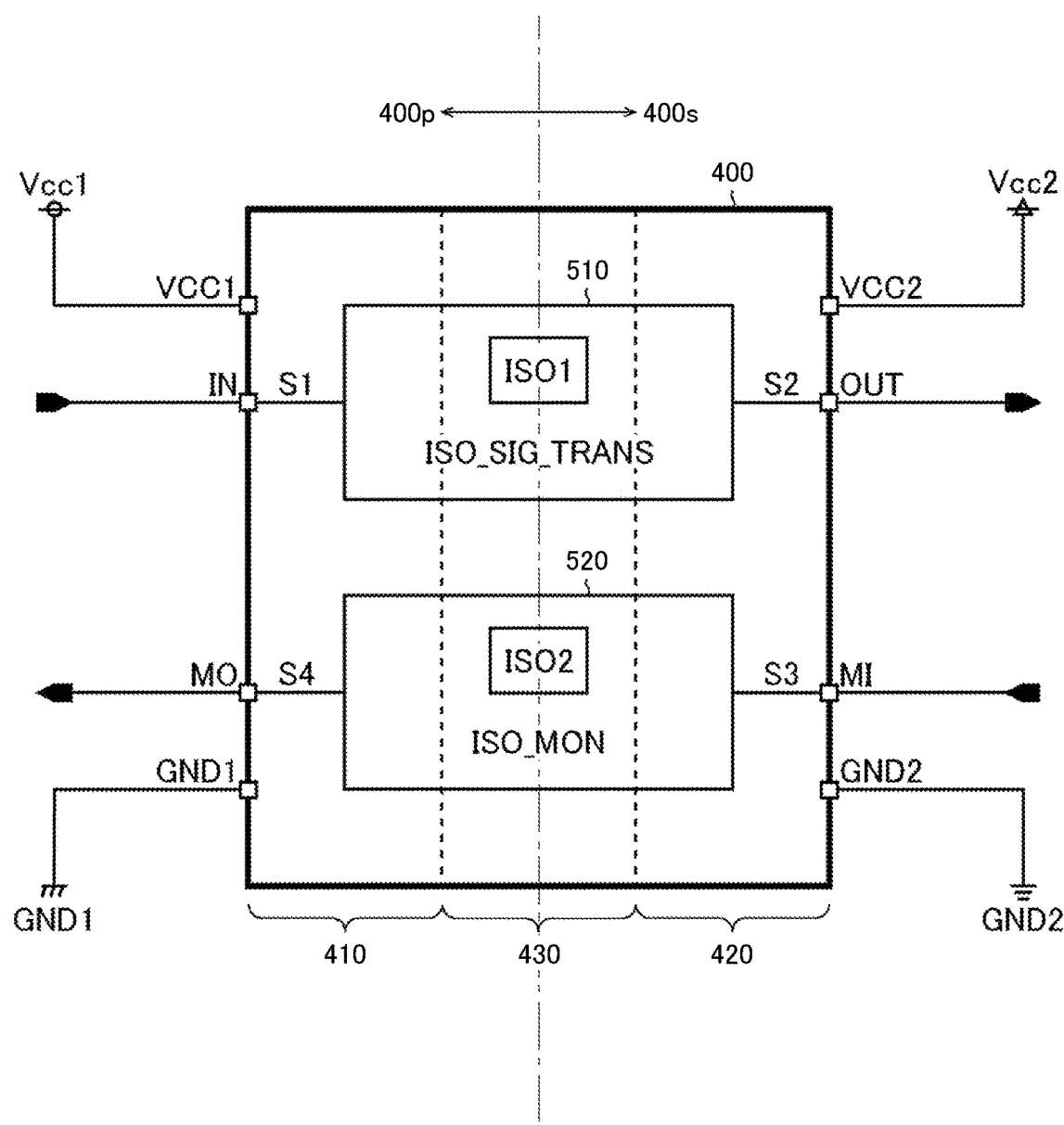
FIG. 10 is a diagram showing a signal transmission device according to one embodiment.

FIG. 10 is a diagram showing a basic configuration of a signal transmission device. The signal transmission device 400 of this embodiment is a semiconductor integrated circuit device (what is generally called an isolated gate driver IC) that, while isolating between a primary circuit system 400p (Vcc1-GND1 system) and a secondary circuit system 400s (Vcc2-GND2 system), transmits a pulse signal from the primary circuit system 400p to the secondary circuit system 400s to drive the gate of a power transistor (unillustrated) provided in the secondary circuit system 400s. The signal transmission device 400 corresponds to the signal transmission device 200 described previously.

The signal transmission device 400 has, as a means for establishing electrical connection with outside it, a plurality of external terminals (of which the diagram shows, as an example, a VCC1 pin, an IN pin, an MO pin, a GND1 pin a VCC2 pin, an OUT pin, an MI pin, and a GND2 pin).

In the primary circuit system 400p, the VCC1 pin (primary-side power supply terminal) is connected to the power supply line of the primary circuit system 400p (i.e., an application terminal for a supply voltage Vcc1). The IN pin (pulse signal input terminal) is connected to an unillustrated input pulse signal source (such as an ECU [electric control unit]). The MO pin (monitoring output terminal) is connected to an unillustrated host device (such as an ECU). The GND1 pin (primary-side ground terminal) is connected to the ground line of the primary circuit system 400p (i.e., an application terminal for a ground voltage GND1).

In the secondary circuit system 400s, the VCC2 pin (secondary-side power supply terminal) is connected to the power supply line of the secondary circuit system 400s (i.e., an application terminal for a supply voltage Vcc2). The OUT pin (pulse signal output terminal) is connected to the gate of an unillustrated power transistor. The MI pin (monitoring input terminal) is connected to an unillustrated monitoring target signal source. The GND2 pin (secondary-side ground terminal) is connected to the ground line of the secondary circuit system 400s (i.e., an application terminal for a ground voltage GND2).

The signal transmission device 400 can be employed widely in applications in general that require signal transmission between a primary circuit system 400p and a secondary circuit system 400s while isolating between them (such as motor drivers and DC/DC converters that handle high voltages).

Referring still to FIG. 10, the internal configuration of the signal transmission device 400 will be described. The signal transmission device 400 of this configuration example has a controller chip 410 (corresponding to a first chip), a driver chip 420 (corresponding to a second chip), and a transformer chip 430 (corresponding to a third chip).

The controller chip 410 is a semiconductor chip having integrated in it the circuit elements of the primary circuit system 400p that operate by being supplied with a supply voltage Vcc1 (e.g., seven volts at the maximum with respect to GND1). The driver chip 420 is a semiconductor chip having integrated in it the circuit elements of the secondary circuit system 400s that operate by being supplied with a supply voltage Vcc2 (e.g., 30 volts at the maximum with respect to GND2). The transformer chip 430 is a semiconductor chip having integrated in it a transformer for bidirectional signal transmission between the controller chip 410 and the driver chip 420 while isolating between them.

As described above, the signal transmission device 400 of this configuration example has, separately from the controller chip 410 and the driver chip 420, the transformer chip 430 that incorporates a transformer alone, and these three chips are sealed in a single package.

With this configuration, the controller chip 410 and the driver chip 420 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

Moreover, the controller chip 410 and the driver chip 420 can each be fabricated by a time-proven existing process. This eliminates the need for conducting reliability tests anew, and contributes to a shortened development period and reduced development costs.

Moreover, use of an isolating element other than a transformer (e.g., a photocoupler) can be coped with easily by solely mounting the alternative in place of the transformer chip 430. This eliminates the need for re-developing down to the controller chip 410 and the driver chip 420, and contributes to a shortened development period and reduced development costs.

The following description focuses on principal functional blocks. The signal transmission device 400 includes an isolated signal transmission circuit 510 and an isolated monitoring circuit 520.

The isolated signal transmission circuit 510 transmits a pulse signal from the primary circuit system 400p to the secondary circuit system 400s while isolating between these via an isolating element ISO1 (such as a transformer) integrated in the transformer chip 430. In terms of what is shown in FIG. 10, the isolated signal transmission circuit 510 transmits an input pulse signal S1, which is fed in via the IN pin of the primary circuit system 400p, as an output pulse signal S2, which is fed out via the OUT pin of the secondary circuit system 400s.

The isolated monitoring circuit 520 monitors a parameter (such as a voltage or temperature) in the secondary circuit system 400s that has to be sensed by a host device (such as an ECU) and transmits the result of its monitoring from the secondary circuit system 400s to the primary circuit system 400p while isolating between these via an isolating element ISO2 (such as a transformer) integrated in the transformer chip 430. In terms of what is shown in FIG. 10, the isolated monitoring circuit 520 monitors a monitoring target signal S3, which is fed in via the MI pin of the secondary circuit system 400s, and transmits it as a monitoring result pulse signal S4, which is fed out via the MO pin of the primary circuit system 400p.

As described above, the signal transmission device 400 inherently incorporates the transformer chip 430 that has integrated in it the isolating element ISO1 used for signal transmission from the primary circuit system 400p to the secondary circuit system 400s. Thus, additionally integrating the isolating element ISO2 for isolated monitoring in the transformer chip 430 described above permits the monitoring result conveyed by the monitoring target signal S3 to be transmitted from the secondary circuit system 400s to the primary circuit system 400p.

The circuit elements of the isolated signal transmission circuit 510 and the isolated monitoring circuit 520 are integrated in a manner distributed among the controller chip 410, the driver chip 420, and the transformer chip 430 (details will be given later).

<Isolated Signal Transmission Circuit>

Figure 11:
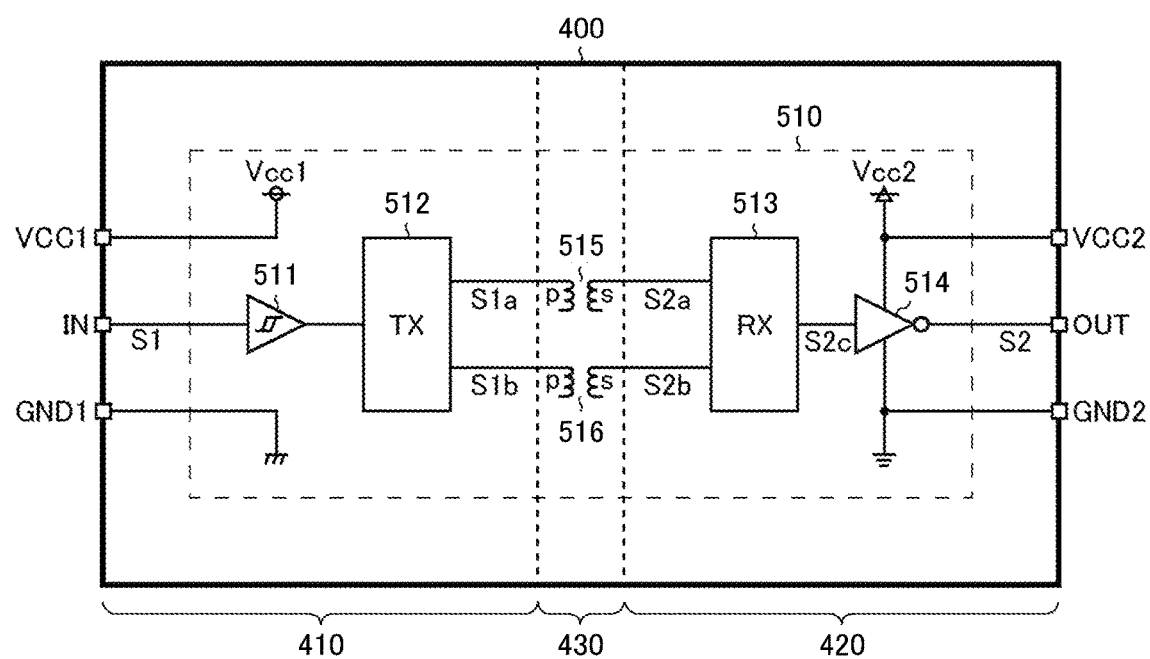
FIG. 11 is a diagram showing one configuration example of an isolated signal transmission circuit.

FIG. 11 is a diagram showing one configuration example of the isolated signal transmission circuit 510. The isolated signal transmission circuit 510 of this configuration example includes a Schmitt buffer 511, a pulse transmitter 512, a pulse receiver 513, a driver 514, and transformers 515 and 516 (corresponding to the isolating element ISO1 mentioned previously).

The Schmitt buffer 511 is one example of a waveform shaper, and is connected between the IN pin and the pulse transmitter 512.

According to the logic level of the input pulse signal S1 fed to it from the IN pin via the Schmitt buffer 511, the pulse transmitter 512 pulse-drives one of transmission pulse signals S1a and S1b. For example, when indicating that the input pulse signal S1 is at high level, the pulse transmitter 512 pulse-drives (outputs a single or a plurality of transmission pulses in) the transmission pulse signal S1a, which is applied to the primary winding 515p of the transformer 515; when indicating that the input pulse signal S1 is at low level, the pulse transmitter 512 pulse-drives the transmission pulse signal S1b, which is applied to the primary winding 516p of the transformer 516.

The Schmitt buffer 511 and the pulse transmitter 512 described above are both integrated in the controller chip 410 in the primary circuit system 400p (Vcc1-GND1 system).

According to reception pulse signals S2a and S2b fed to it from the transformers 515 and 516 respectively, the pulse receiver 513 generates a reception pulse signal S2c. For example, on detecting an induced pulse in the reception pulse signal S2a appearing in the secondary winding 515s of the transformer 515 in response to the transmission pulse signal S1a being pulse-driven, the pulse receiver 513 drops the reception pulse signal S2c to low level; on detecting an induced pulse in the reception pulse signal S2b appearing in the secondary winding 516s of the transformer 516 in response to the transmission pulse signal S1b being pulse-driven, the pulse receiver 513 raises the reception pulse signal S2c to high level.

According to the reception pulse signal S2c fed to it from the pulse receiver 513, the driver 514 generates the output pulse signal S2 (corresponding to the gate signal for an unillustrated power transistor). For example, in a case where the driver 514 is implemented with an inverter, when the reception pulse signal S2c is at low level, the output pulse signal S2 is at high level and, when the reception pulse signal S2c is at high level, the output pulse signal S2 is at low level. Thus, the logic level of the output pulse signal S2 switches according to the logic level of the input pulse signal S1.

The pulse receiver 513 and the driver 514 described above are both integrated in the driver chip 420 in the secondary circuit system 400s (Vcc2-GND2 system).

According to the transmission pulse signal S1a fed to its primary winding 515p, the transformer 515 outputs the reception pulse signal S2a from its secondary winding 515s. On the other hand, according to the transmission pulse signal S1b fed to its primary winding 516p, the transformer 516 outputs the reception pulse signal S2b from its secondary winding 516s.

The transformers 515 and 516 described above are both integrated in the transformer chip 430. The transformer chip 430 transmits the transmission pulse signals S1a and S1b fed to it from the pulse transmitter 512 to, as the reception pulse signals S2a and S2b respectively, to the pulse receiver 513 while isolating between the controller chip 410 and the driver chip 420 with the transformers 515 and 516.

In this way, owing to the characteristics of spiral coils used in isolated communication, the input pulse signal S1 is split into two transmission pulse signals S1a and S1b (corresponding to a rise signal and a fall signal) to be transmitted via the transformers 515 and 516 in two channels from the primary circuit system 400p to the secondary circuit system 400s.

Figure 12:
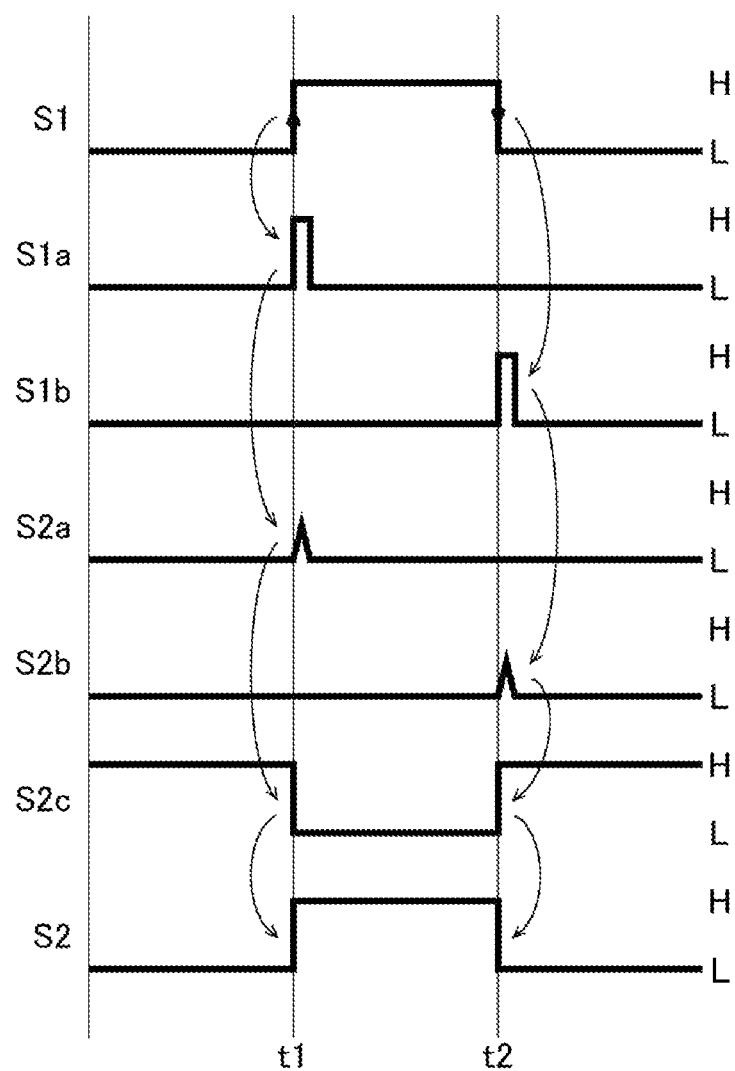
FIG. 12 is a diagram showing one example of isolated signal transmission operation.

FIG. 12 is a diagram showing one example of isolated signal transmission operation by the isolated signal transmission circuit 510, depicting, from top down, the input pulse signal S1, the transmission pulse signals S1a and S1b, the reception pulse signals S2a to S2c, and the output pulse signal S2. In the diagram, for the sake of convenience, signal delays are omitted from illustration.

At a rising edge in the input pulse signal S1 at time point t1, the pulse transmitter 512 pulse-drives the transmission pulse signal S1a and, at a falling edge in the input pulse signal S1 at time point t2, the pulse transmitter 512 pulse-drives the transmission pulse signal S1b. On detecting an induced pulse in the reception pulse signal S2a resulting from the transmission pulse signal S1a being pulse-driven, the pulse receiver 513 drops the reception pulse signal S2c to low level and, on detecting an induced pulse in the reception pulse signal S2b resulting from the transmission pulse signal S1b being pulse-driven, the pulse receiver 513 raises the reception pulse signal S2c to high level. As a result, when the input pulse signal S1 rises to high level, the output pulse signal S2 too rises to high level and, when the input pulse signal S1 falls to low level, the output pulse signal S2 too falls to low level.

<Isolated Monitoring Circuit (First Embodiment)>

Figure 13:
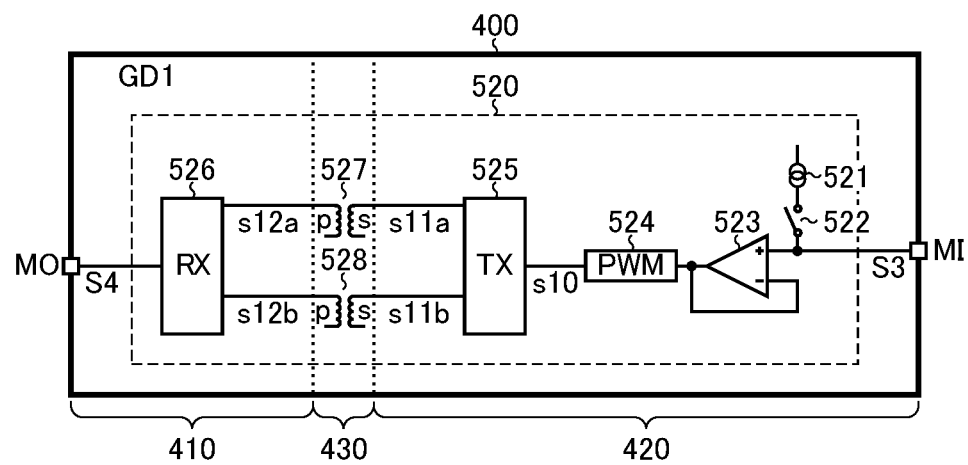
FIG. 13 is a diagram showing an isolated monitoring circuit according to a first embodiment.

FIG. 13 is a diagram showing the isolated monitoring circuit 520 according to a first embodiment. The isolated monitoring circuit 520 of this embodiment includes a current source 521, a switch 522, a buffer 523, a pulse converter 524, a pulse transmitter 525, a pulse receiver 526, and transformers 527 and 528 (corresponding to the isolating element ISO2 described above).

The current source 521 generates a source current to be fed to the MI pin.

The switch 522 switches between a conducting state and a cut-off state the path between the current source 521 and the MI pin. That is, with the switch 522 on, the source current passes via the MI pin; with the switch 522 off, no source current passes via the MI pin.

The buffer 523 transmits the monitoring target signal S3, which is fed in from outside via the MI pin, to the pulse converter 524 in the succeeding stage.

The pulse converter 524 generates a PWM (pulse width modulation) signal s10 with a duty commensurate with the signal value of the monitoring target signal S3, which is fed to the pulse converter 524 via the buffer 523. For example, the higher the signal value of the monitoring target signal S3, the higher the duty of the PWM signal s10 and, the lower the signal value of the monitoring target signal S3, the lower the duty of the PWM signal s10. The relationship may be reversed such that, the higher the signal value of the monitoring target signal S3, the lower the duty of the PWM signal s10 and, the lower the signal value of the monitoring target signal S3, the higher the duty of the PWM signal s10.

According to the logic level of the PWM signal s10, the pulse transmitter 525 pulse-drives one of transmission pulse signals s11a and s11b. For example, when indicating that the PWM signal s10 is at high level, the pulse transmitter 525 pulse-drives (outputs a single or a plurality of transmission pulses in) the transmission pulse signal s11a, which is applied to the secondary winding 527s of the transformer 527; when indicating that the PWM signal s10 is at low level, the pulse transmitter 525 pulse-drives the transmission pulse signal s11b, which is applied to the secondary winding 528s of the transformer 528.

The current source 521, the switch 522, the buffer 523, the pulse converter 524, and the pulse transmitter 525 described above are all integrated in the driver chip 420 in the secondary circuit system 400s (Vcc2-GND2 system).

According to reception pulse signals s12a and s12b fed to it from the transformers 527 and 528 respectively, the pulse receiver 526 generates the monitoring result pulse signal S4 and feeds it via the MO pin to a host device (such as an ECU). For example, on detecting an induced pulse in the reception pulse signal s12a appearing in the primary winding 527p of the transformer 527 in response to the transmission pulse signal s11a being pulse-driven, the pulse receiver 526 raises the monitoring result pulse signal S4 to high level; on detecting an induced pulse in the reception pulse signal s12b appearing in the primary winding 528p of the transformer 528 in response to the transmission pulse signal s11b being pulse-driven, the pulse receiver 526 drops the monitoring result pulse signal S4 to low level. Thus, the logic level of the monitoring result pulse signal S4 switches according to the logic level of the PWM signal s10.

The pulse receiver 526 described above is integrated in the controller chip 410 in the primary circuit system 400p (Vcc1-GND1 system).

According to the transmission pulse signal s11a fed to its secondary winding 527s, the transformer 527 outputs the reception pulse signal s12a from its primary winding 527p. On the other hand, according to the transmission pulse signal s11b fed to its secondary winding 528s, the transformer 528 outputs the reception pulse signal s12b from its primary winding 528p.

The transformers 527 and 528 described above are both integrated in the transformer chip 430. The transformer chip 430 outputs the transmission pulse signals s11a and s11b fed to it from the pulse transmitter 525 to, as the reception pulse signals s12a and s12b respectively, the pulse receiver 526 while isolating between the controller chip 410 and the driver chip 420 with the transformers 527 and 528.

In this way, owing to the characteristics of spiral coils used in isolated communication, the PWM signal s10 generated in the secondary circuit system 400s is split into two transmission pulse signals s11a and s11b (corresponding to a rise signal and a fall signal) to be transmitted via the transformers 527 and 528 in two channels to the primary circuit system 400p.

In the following description, the signal transmission device 400 provided with the isolated monitoring circuit 520 according to the first embodiment will be referred to as the "signal transmission device GD1" for distinction from any other.

First Application Example

Figure 14:
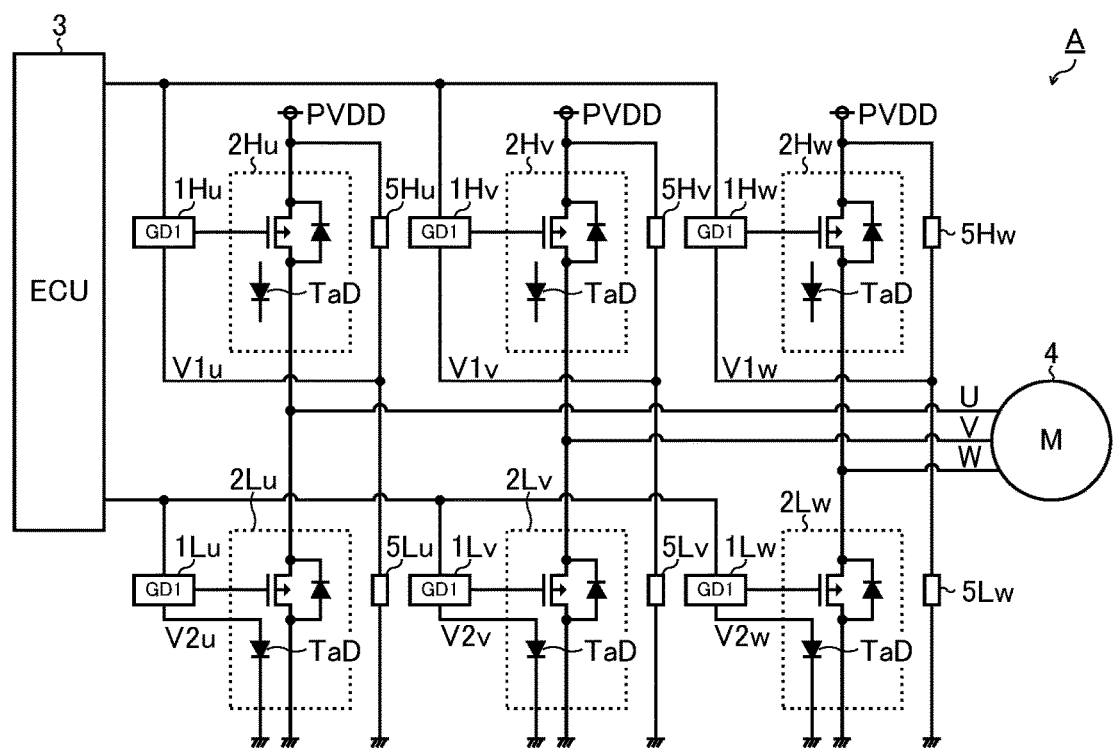
FIG. 14 is a diagram showing a first application example of a signal transmission device.

FIG. 14 is a diagram showing one configuration example (corresponding to a first application example) of an electronic device that incorporates the signal transmission device GD1. The electronic device A of this configuration example includes high-side gate driver ICs 1H(u/v/w), low-side gate driver ICs 1L(u/v/w), high-side power transistors 2H(u/v/w), low-side power transistors 2L(u/v/w), an ECU 3, a motor 4, resistors 5H(u/v/w), and resistors 5L(u/v/w).

The high-side gate driver ICs 1H(u/v/w), while isolating between the ECU 3 and the high-side power transistors 2H(u/v/w) respectively, generate high-side gate drive signals (corresponding to the output pulse signal S2) according to the high-side gate signals (corresponding to the input pulse signal S1) fed from the ECU 3, and thereby drive the high-side power transistors 2H(u/v/w).

The low-side gate driver ICs 1L(u/v/w), while isolating between the ECU 3 and the low-side power transistors 2L(u/v/w) respectively, generate low-side gate drive signals (corresponding to the output pulse signal S2) according to the low-side gate signals (corresponding to the input pulse signal S1) fed from the ECU 3, and thereby drive the low-side power transistors 2L(u/v/w).

In FIG. 14, the high- and low-side gate driver ICs 1H(u/v/w) and 1L(u/v/w) are each implemented with the signal transmission device GD1 (FIG. 13) incorporating the isolated monitoring circuit 520 according to the first embodiment.

The high-side power transistors 2H(u/v/w) are each connected, as a high-side switch in a half-bridge output stage for one of three phases (U/V/W phases) respectively, between a power-system power supply terminal (i.e., an application terminal for a motor drive voltage PVDD) and the input terminal of the motor 4 for the corresponding phase.

The low-side power transistors 2L(u/v/w) are each connected, as a low-side switch in a half-bridge output stage for one of three phases (U/V/W phases) respectively, between the input terminal of the motor 4 for the corresponding phase and a power-system ground terminal.

The high- and low-side power transistors 2H(u/v/w) and 2L(u/v/w) each include a temperature sensor TaD (e.g., a silicon diode) for sensing the ambient temperature Ta. Accordingly, if there is need to acquire information on the ambient temperature Ta, it can be achieved by passing the source current through the temperature sensor TaD and reading the temperature sense voltage V2(u/v/w) (e.g., corresponding to the forward drop voltage Vf across the silicon diode, which varies with temperature).

In the diagram, the high- and low-side power transistors 2H(u/v/w) and 2L(u/v/w) are all implemented as N-channel MOSFETs (metal-oxide-semiconductor field-effect transistors). The high-side power transistors 2H(u/v/w) may instead be implemented, for example, as P-channel MOSFETs. Instead of MOSFETs, IGBTs (insulated-gate bipolar transistors) may be used.

The ECU 3 drives the high- and low-side power transistors 2H(u/v/w) and 2L(u/v/w) via the high- and low-side gate driver ICs 1H(u/v/w) and 1L(u/v/w) respectively, and thereby controls the driving of the rotation of the motor 4. The ECU 3 also has a function of performing overvoltage protection operation and overheat protection operation based on monitoring results acquired in the isolation monitoring circuit 520 (unillustrated) in each of the high- and low-side gate driver ICs 1H(u/v/w) and 1L(u/v/w).

The motor 4 is a three-phase motor that is driven to rotate according to three-phase driving voltages U/V/W fed from the half-bridge output stages for three phases (U/V/W phases) respectively.

The resistors 5H(u/v/w) and 5L(u/v/w) are each connected in series between the power-system power supply terminal and the power-system ground terminal, and output division voltages V1(u/v/w) commensurate with the motor drive voltage PVDD (e.g., 48 V to 700 V) from the connection nodes for the corresponding phases.

In the first application example in FIG. 14, the high-side gate driver ICs 1H(u/v/w) are fed with the division voltages V1(u/v/w) respectively. On the other hand, the low-side gate driver ICs 1L(u/v/w) are fed with the temperature sense voltages V2(u/v/w) respectively. Thus, different isolated monitoring circuits 520 are used for different purposes such that, with the high-side gate driver ICs 1H(u/v/w), the motor drive voltage PVDD is indirectly monitored and that, with the low-side gate driver ICs 1L(u/v/w), the ambient temperature Ta is monitored.

Figure 15:
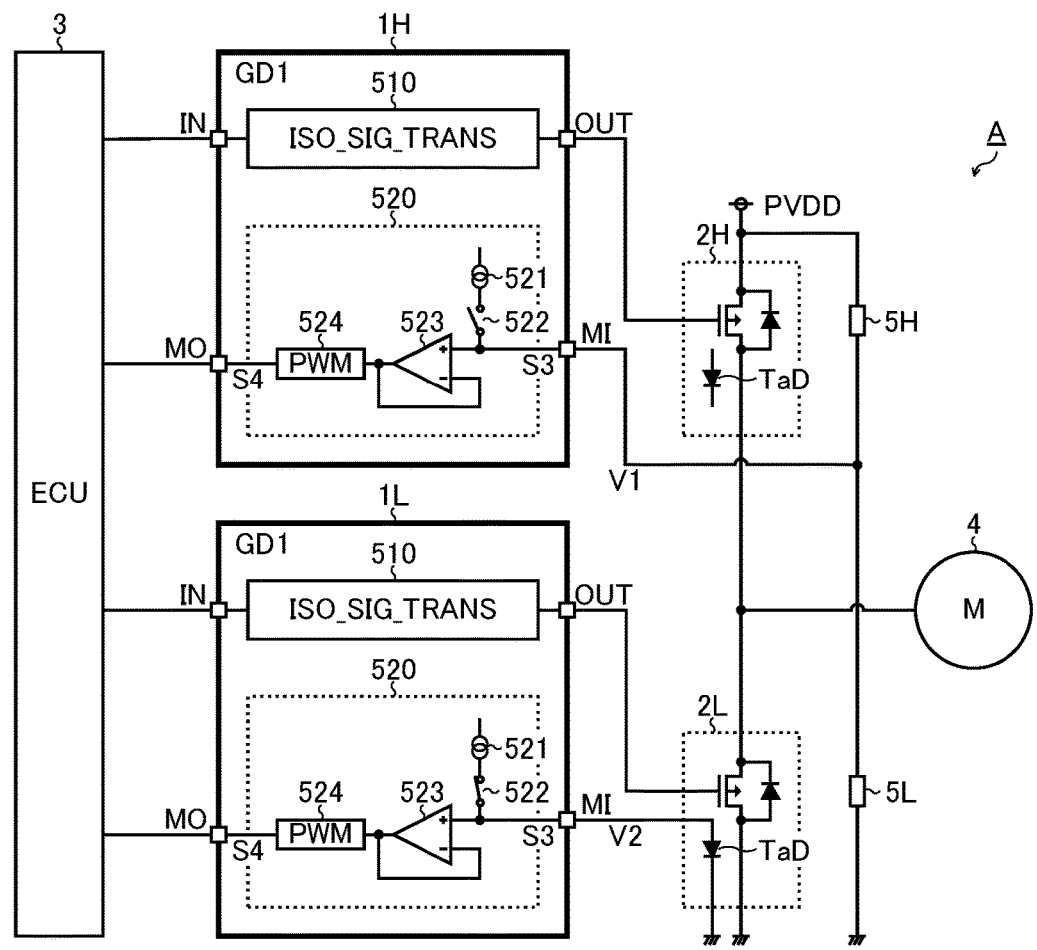
FIG. 15 is a diagram showing, in an extracted form, only the part corresponding to one phase of the first application example.

FIG. 15 is a diagram showing, in an extracted form, only the part corresponding to one phase of the first application example (FIG. 14). For the sake of convenience, the output terminal of the pulse converter 524 is there depicted to be connected directly to the MO pin while, in practice, between the pulse converter 524 and the MO pin are provided the pulse transmitter 525, the transformer 527, and the pulse receiver 526 (see FIG. 13 referred to previously).

As shown in FIG. 15, the MI pin of the high-side gate driver IC 1H is connected to the connection node between the resistors 5H and 5L. Accordingly, the isolated monitoring circuit 520 is fed with, as the monitoring target signal S3, the division voltage V1. At this time, the switch 522 is off, and thus no source current passes from the current source 521 to the MI pin.

On the other hand, the MI pin of the low-side gate driver IC 1L is connected to the temperature sensor TaD in the low-side transistor 2L. At this time, the switch 522 is on, and thus the source current passes from the current source 521 to the MI pin (hence to the temperature sensor TaD) Accordingly, the isolated monitoring circuit 520 is fed with, as the monitoring target signal S3, the temperature sense voltage V2.

With this configuration, the ECU 3 can on one hand acquire information on the motor drive voltage PVDD based on the monitoring result pulse signal S4, which is fed to the ECU 3 from the high-side gate driver IC 1H, and can on the other hand acquire information on the ambient temperature Ta based on the monitoring result pulse signal S4, which is fed to the ECU 3 from the low-side gate driver IC 1L.

Even the first application example, where the high- and low-side gate driver ICs 1H(u/v/w) and 1L(u/v/w) are each implemented with the signal transmission device GD1, leaves room for further studies from the perspectives of cost reduction and quality improvement (robustness improvement).

A study from the perspective of cost reduction reveals the following. In the first application example described above, the isolated monitoring circuit 520 is incorporated in each of the six signal transmission devices GD1. However, in cases where the monitoring target is a DC voltage or temperature that is free from instantaneous variations (variations of the order of several milliseconds), incorporating the isolated monitoring circuit 520 in each of the six signal transmission devices GD1 may be wasteful and lead to increased cost.

Even in a case where monitoring is performed for only one of the phases, monitoring both the motor drive voltage PVDD and the ambient temperature Ta requires that the isolated monitoring circuit 520 be incorporated in each of at least two, high- and low-side, signal transmission devices GD1, and this leaves room for further cost reduction.

On the other hand, a study from the perspective of quality improvement (robustness improvement) reveals the following. Although the electronic device A of the first application example includes six signal transmission devices GD1, each of those signal transmission devices GD1 cannot monitor the division voltage V1 (hence the motor drive voltage PVDD) and the temperature sense voltage V2 at the same time. This restricts robustness improvement in a system where high quality is required in the voltage-monitoring and temperature-monitoring functions by the ECU 3.

Presented below will be a novel embodiment that provides a solution to the problems discussed above.

<Isolated Monitoring Circuit (Second Embodiment)>

Figure 16:
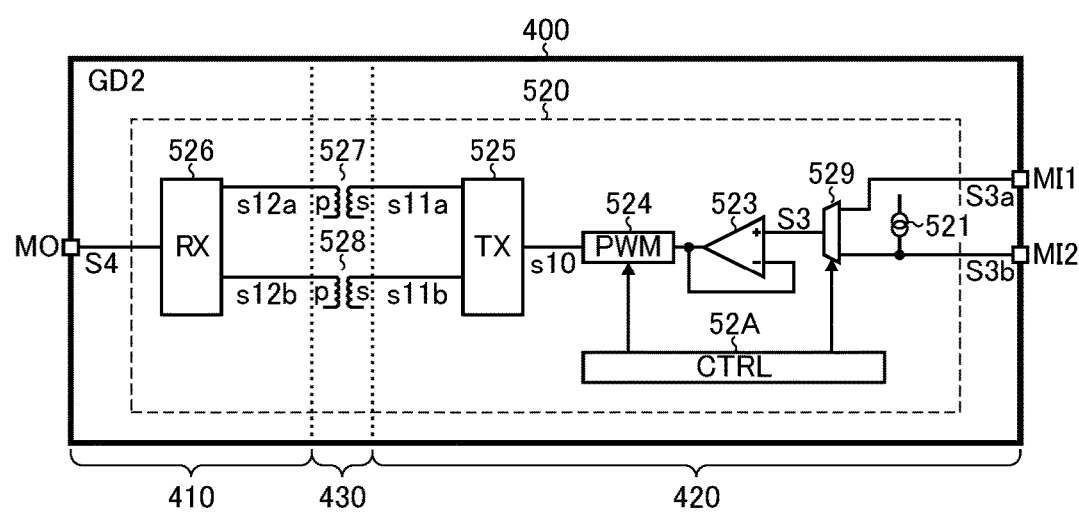
FIG. 16 is a diagram showing an isolated monitoring circuit according to a second embodiment.

FIG. 16 is a diagram showing the isolated monitoring circuit 520 according to a second embodiment. The isolated monitoring circuit 520 of this embodiment has a function (time-division monitoring function) of monitoring, on a time-division basis, a monitoring target signal S3a (i.e., voltage information), which is fed to an MI1 pin, and a monitoring target signal S3b (i.e., temperature information), which is fed to an MI2 pin, and transmitting the results of their respective monitoring from the secondary circuit system 400s to the primary circuit system 400p via the transformer 527.

To achieve such a time-division monitoring function, the isolated monitoring circuit 520 according to this embodiment, while being based on the first embodiment (FIG. 13) described previously, forgoes the switch 522 and additionally includes a multiplexer 529 and a controller 52A. It moreover includes an increased number, specifically not one but two, of MI pins (MI1 pin and MI2 pin). The current source 521 is connected to the MI2 pin.

The multiplexer 529 selectively outputs one of the monitoring target signals S3a and S3b fed in via the MI1 and MI2 pins respectively as the monitoring target signal S3 to the buffer 523. In a case where the multiplexer 529 is provided outside the signal transmission device 400, an MI pin for a single input may be provided. In that case, however, an extra external terminal is needed for the control of the multiplexer, and also the switch 522 cannot be omitted.

The controller 52A controls the multiplexer 529 and the pulse converter 524 with predetermined timing so as to monitor the monitoring target signals S3a and S3b on a time-division basis.

For example, in a period T1 in which to monitor the monitoring target signal S3a, the controller 52A controls the multiplexer 529 so that the monitoring target signal S3a fed to the MI1 pin is selectively output as the monitoring target signal S3 and, in a period T2 in which to monitor the monitoring target signal S3b, the controller 52A controls the multiplexer 529 so that the monitoring target signal S3b fed to the MI2 pin is selectively output as the monitoring target signal S3. Accordingly, in the pulse converter 524, the signal values of the monitoring target signals S3a and S3b are converted on a time-division basis into a single PWM signal s10 (hence into the monitoring result pulse signal S4) (details will be given later).

Moreover, for example, the controller 52A controls the pulse converter 524 so as to generate a discrimination pulse for notifying the ECU 3 whether the PWM signal s10 generated in the pulse converter 524 indicates the signal value of the monitoring target signal S3a (i.e., voltage information) or the signal value of the monitoring target signal S3b (i.e., temperature information) (details will be given later).

While FIG. 16 shows an example where the monitoring results are conveyed from the isolated monitoring circuit 520 to the ECU 3 (not illustrated) by PWM output, the monitoring results may be conveyed in any other manner. For example, the isolated monitoring circuit 520 may be provided with registers for saving the signal values of the monitoring target signals S3a and S3b respectively and the monitoring results may be conveyed to the ECU 3 by use of a CPU (central processing unit) interface, such as I²C (inter-integrated circuit) or UART (universal asynchronous receiver/transmitter), or by an interface conforming to a standard for vehicle onboard communication, such as LIN (local interconnect network) or CAN (controller area network).

<Time-Division Control>

Figure 17:
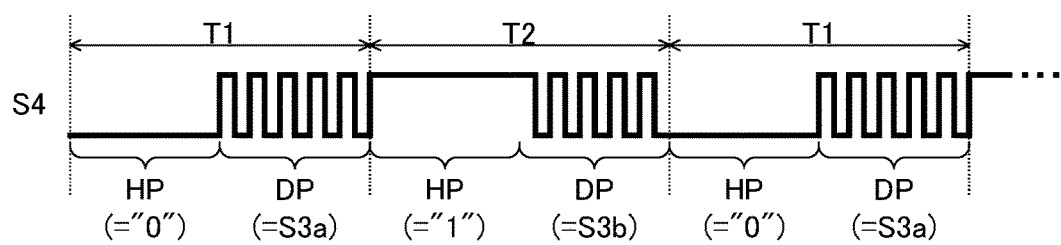
FIG. 17 is a diagram showing a first example of time-division control.

FIG. 17 is a diagram showing a first example of the time-division control by the isolated monitoring circuit 520 according to the second embodiment. As shown there, the monitoring result pulse signal S4 contains header pulses HP and data pulses DP alternately.

The header pulse HP serves as a discrimination pulse for notifying the ECU 3 whether the subsequent data pulse DP indicates the signal value of the monitoring target signal S3a (i.e., voltage information) or the signal value of the monitoring target signal S3b (i.e., temperature information).

The data pulse DP serves as the PWM signal s10 with a duty commensurate with the signal value of the monitoring target signal S3a or S3b.

For example, during the period T1, as the monitoring result pulse signal S4, first a header pulse HP having a period longer than one period of the data pulse DP and held at low level for a predetermined length of time is output and then a data pulse (pulse train) DP having a duty commensurate with the signal value of the monitoring target signal S3a (i.e., voltage information) is output. The header pulse HP held at low level indicates that the subsequent data pulse DP conveys the signal value of the monitoring target signal S3a (i.e., voltage information). Thus, the ECU 3 can acquire voltage information on the secondary circuit system 400s from the monitoring result pulse signal S4 during the period T1.

On the other hand, during the period T2, as the monitoring result pulse signal S4, first a header pulse HP having a period longer than one period of the data pulse DP and held at high level for a predetermined length of time is output and then a data pulse (pulse train) DP having a duty commensurate with the signal value of the monitoring target signal S3b (i.e., temperature information) is output. The header pulse HP held at high level indicates that the subsequent data pulse DP conveys the signal value of the monitoring target signal S3b (i.e., temperature information). Thus, the ECU 3 can acquire temperature information on the secondary circuit system 400s from the monitoring result pulse signal S4 during the period T1.

In this way, with the isolated monitoring circuit 520 according to the second embodiment, through cyclic repetition of the periods T1 and T2, based on a single monitoring result pulse signal S4, the signal values of the monitoring target signals S3a and S3b respectively can be output on a time-division basis.

Figure 18:
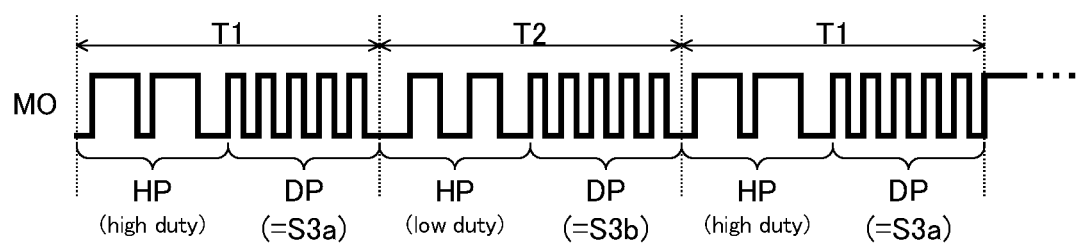
FIG. 18 is a diagram showing a second example of time-division control.

FIG. 18 is a diagram showing a second example of the time-division control by the isolated monitoring circuit 520 according to the second embodiment. As shown there, the header pulse HP need not be held at high or low level; it only needs to permit univocal distinction of whether the subsequent data pulse DP indicates the signal value of the monitoring target signal S3a or S3b.

For example, in a case where a PWM signal is used as the header pulse HP, it can be given a high duty when indicating that the data pulse DP represents the signal value of the monitoring target signal S3a (i.e., voltage information) and a low duty when indicating that the data pulse DP represents the signal value of the monitoring target signal S3b (i.e., temperature information). Here, for clear distinction between the header pulse HP and the data pulse DP, it is preferable that they be given different periods such that, for example, one period of the header pulse HP is shorter than one period of the data pulse DP. The time-division control of the second example is particularly effective in cases where three or more channels of monitoring target signals have to be handled.

While the above description deals with an example where the data pulse DP is preceded by the header pulse HP, the data pulse DP may be followed by a footer pulse to yield a framed output.

In the following description, the signal transmission device 400 provided with the isolated monitoring circuit 520 according to the second embodiment will be referred to as the "signal transmission device GD2" for distinction from any other. On the other hand, an inexpensive signal transmission device 400 not provided with the isolated monitoring circuit 520 will be referred to as the "signal transmission device GD0" for distinction from any other.

Second Application Example

Figure 19:
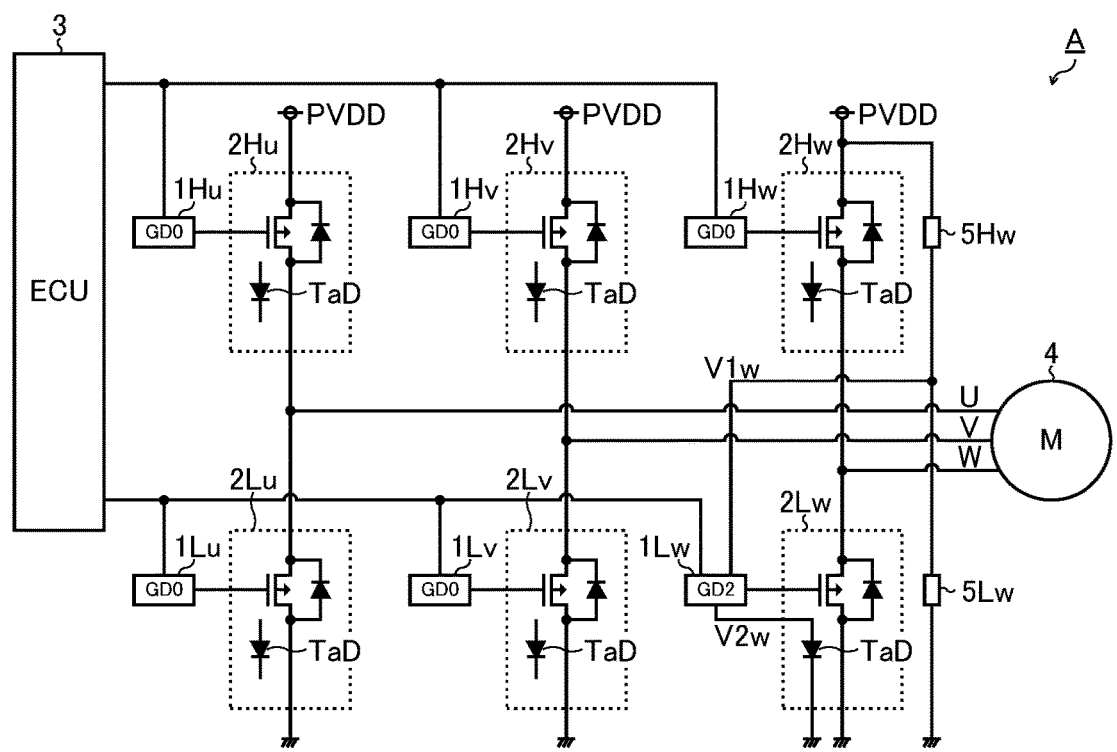
FIG. 19 is a diagram showing a second application example of a signal transmission device.

FIG. 19 is a diagram showing one configuration example (corresponding to a second application example) of an electronic device that incorporates the signal transmission device GD2.

The electronic device A of this configuration example, while being based on the first application example (FIG. 14), employs the signal transmission device GD2 (FIG. 16) as the low-side gate driver IC 1Lw, and employs the inexpensive signal transmission device GD0 as each of all the other high- and low-side gate drivers IC 1H(u/v/w) and 1L (u/v).

Moreover, the electronic device A of this configuration example forgoes the resistors 5H(u/v) and 5L(u/v), which are no longer necessary.

In the second application example shown in the diagram, the low-side gate driver IC 1Lw is fed with both a division voltage V1w and a temperature sense voltage V2w. That is, monitoring functions are concentrated on the low-side gate driver IC 1Lw so that, with the low-side gate driver IC 1Lw alone, both the motor drive voltage PVDD and the ambient temperature Ta are monitored on a time-division basis. On the other hand, the other five gate driver ICs are focused on a single function for cost reduction.

The signal transmission device GD2 need not be used as the low-side gate driver IC 1Lw of the W phase; the signal transmission device GD2 may be used as any one of the six high- and low-side gate driver ICs 1H(u/v/w) and 1L(u/v/w).

Figure 20:
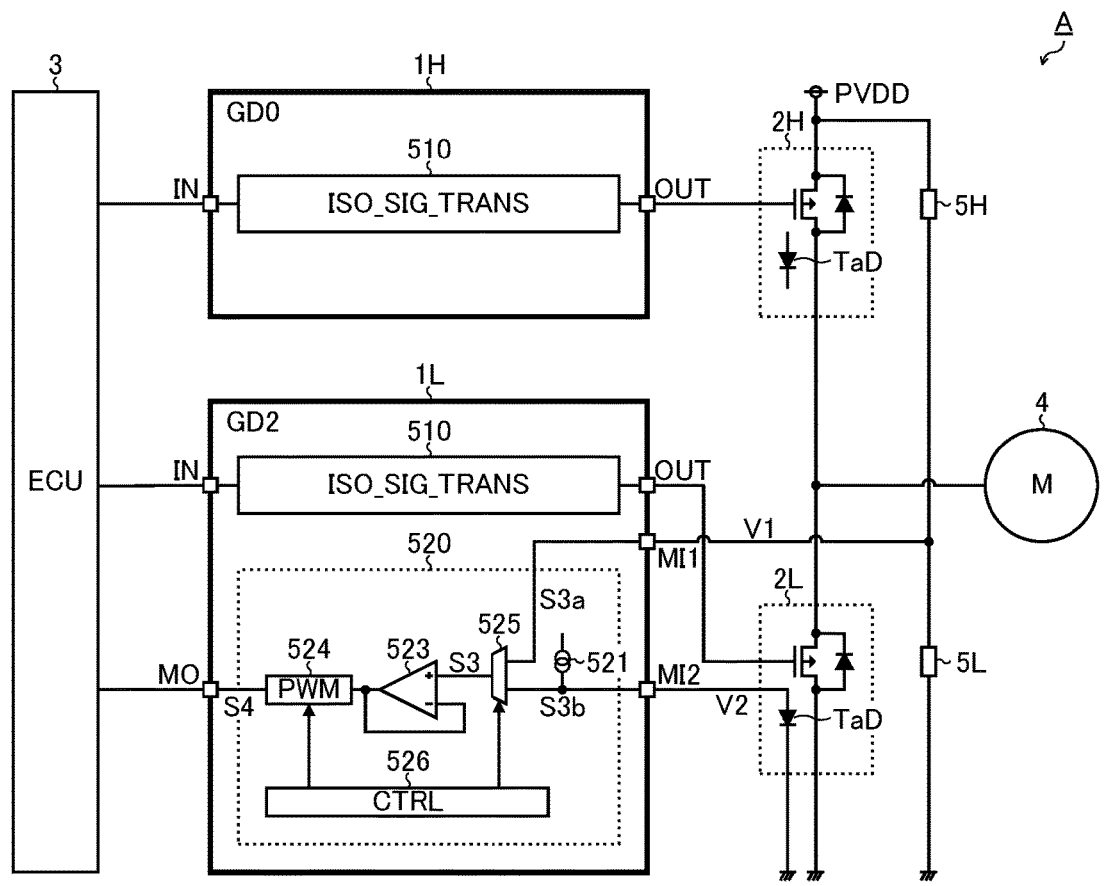
FIG. 20 is a diagram showing, in an extracted form, only the part corresponding to one phase of the second application example.

FIG. 20 is a diagram showing, in an extracted form, only the part corresponding to one phase of the second application example (FIG. 19). For the sake of convenience, the output terminal of the pulse converter 524 is there depicted to be connected directly to the MO pin while, in practice, between the pulse converter 524 and the MO pin are provided the pulse transmitter 525, the transformer 527, and the pulse receiver 526 (see FIG. 16 referred to previously).

As shown in FIG. 20, used as the high-side gate driver IC 1H is the signal transmission device GD0 not provided with the isolated monitoring circuit 520. On the other hand, used as the low-side gate driver IC 1L is one incorporating the isolated monitoring circuit 520 provided with a time-division monitoring function.

The MI pin of the low-side gate driver IC 1L is connected to the connection node between the resistors 5H and 5L. Accordingly, the isolated monitoring circuit 520 is fed with, as the monitoring target signal S3a, the division voltage V1.

On the other hand, the MI2 pin of the low-side gate driver IC 1L is connected to the temperature sensor TaD in the low-side power transistor 2L. Since the current source 521 is connected to the MI2 pin, the source current passes from the current source 521 to the MI2 pin (hence to the temperature sensor TaD). Accordingly, the isolated monitoring circuit 520 is fed with, as the monitoring target signal S3b, the temperature sense voltages V2(u/v/w).

As described previously, the controller 52A controls the multiplexer 529 and the pulse converter 524 with predetermined timing so as to monitor the monitoring target signals S3a and S3b on a time-division basis. The results of the monitoring of the monitoring target signals S3a and S3b respectively are transmitted from the low-side gate driver IC 1L to the ECU 3 on a time-division basis.

With this configuration, the ECU 3 can acquire both information on the motor drive voltage PVDD and information on the ambient temperature Ta based on the monitoring result pulse signal S4, which is fed to the ECU 3 from the low-side gate driver IC 1L.

Among the six high- and low-side gate driver ICs 1H(u/v/w) and 1L(u/v/w), only one can be implemented with the signal transmission device GD2 while all the other with the signal transmission device GD0. This helps greatly reduce the cost of the application as a whole.

Third Application Example

Figure 21:
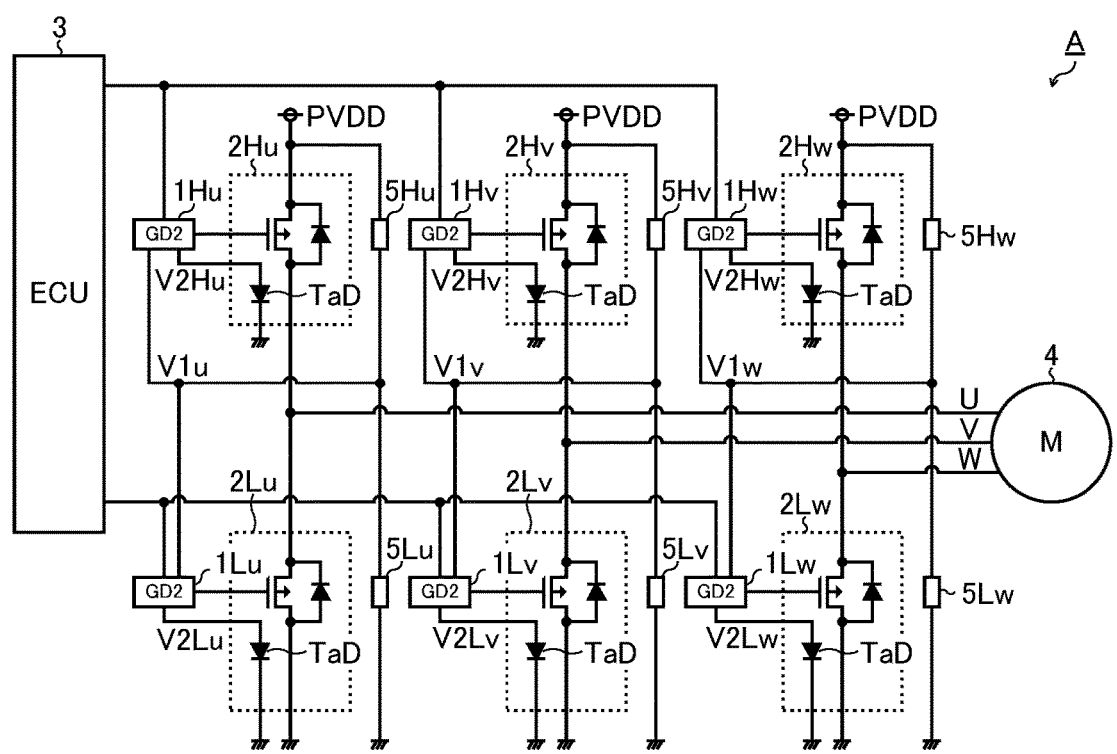
FIG. 21 is a diagram showing a third application example of a signal transmission device.

FIG. 21 is a diagram showing another configuration example (corresponding to a third application example) of an electronic device that incorporates the signal transmission device GD2. While the second application example described previously (FIG. 19) is directed to cost reduction, the third application example is directed to improved quality (improved robustness), implementing the six high- and low-side gate driver ICs 1H(u/v/w) and 1L(u/v/w) each with the signal transmission device GD2.

Specifically, the high- and low-side gate driver ICs 1H(u/v/w) and 1L(u/v/w) are fed with both the division voltages V1(u/v/w) and the temperature sense voltages V2H and V2L(u/v/w) respectively, and the results (voltage information and temperature information) of their respective monitoring are transmitted to the ECU 3 on a time-division basis.

With this configuration, the ECU 3 can acquire information on the motor drive voltages PVDD in six channels and, likewise, information on the ambient temperatures Ta in six channels based on the monitoring result pulse signal S4 output from each of the high- and low-side gate driver ICs 1H(u/v/w) and 1L(u/v/w).

Thus, the ECU 3 can perform a quality improving process (such as adopting majority decision, calculating an average value, or discarding a value aberrant compared with other values) on the voltage information or temperature information in each of the six channels. In this way, it is possible to improve the quality of the voltage monitoring function and the temperature monitoring function by the ECU 3 (to improve its robustness).

Incidentally, a monitoring circuit that can monitor a plurality of monitoring target signals on a time-division basis can be applied not only to isolated signal transmission devices but also to non-isolated signal transmission devices.
<Pulse Converter>

Figure 22:
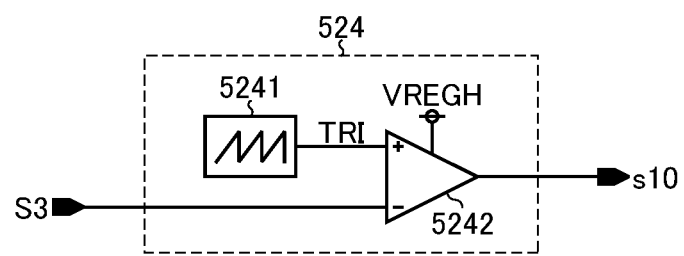
FIG. 22 is a diagram showing one configuration example of a pulse converter.

FIG. 22 is a diagram showing one configuration example of the pulse converter 524. As mentioned previously, the pulse converter 524 of this configuration example is a circuit block that converts the monitoring target signal S3 (corresponding to an analog signal), which is fed to the pulse converter 524 via the buffer 523, into the PWM signal s10 (corresponding to a pulse signal), which conveys the result of the monitoring of the former. The pulse converter 524 includes a triangular-wave oscillator 5241 and a comparator 5242.

The triangular-wave oscillator 5241 generates a triangular-wave signal TRI with a triangular or sawtooth waveform.

The comparator 5242 generates the PWM signal s10 by comparing the triangular-wave signal TRI, which is fed to the non-inverting input terminal (+) of the comparator 5242, with the monitoring target signal S3, which is fed to the inverting input terminal (−) of the comparator 5242. Here, the PWM signal s10 is at high level when TRI>S3, and is at low level when TRI<S3. Accordingly, the higher the monitoring target signal S3, the lower the duty of the PWM signal s10; the lower the monitoring target signal S3, the higher the PWM signal s10. The input polarities of the comparator 5242 may be reversed compared with what is shown in FIG. 22. Preferable as the driving voltage for comparator 5242 is a constant voltage VREGH with low dependence on temperature and supply power (such as a band gap voltage or a regulator voltage).
<Triangular-Wave Oscillator>

Figure 23:
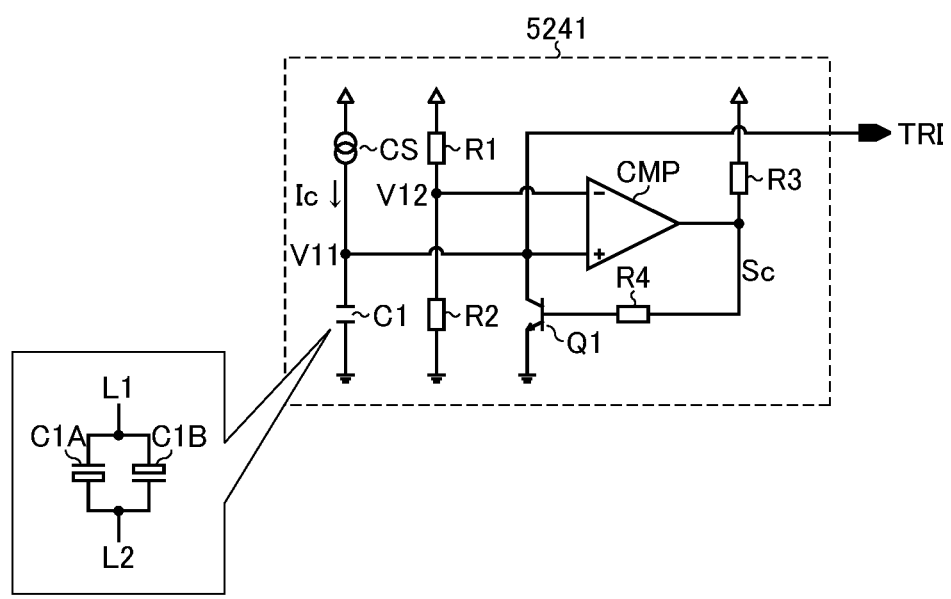
FIG. 23 is a diagram showing one configuration example of a triangular-wave oscillator.

FIG. 23 is a diagram showing one configuration example of the triangular-wave oscillator 5241. The triangular-wave oscillator 5241 of this configuration example is an oscillator of a capacitor charging-discharging type. The triangular-wave oscillator 5241 includes a comparator CMP, a current source CS, a capacitor C1, an npn-type bipolar transistor Q1, and resistors R1 to R4.

The first terminals of the current source CS and the resistor R1 are both connected to a power supply terminal. The second terminal of the current source CS and the first terminal of the capacitor C1 correspond to an application terminal for a charge voltage V11, and are both connected to the non-inverting input terminal (+) of the comparator CMP. Here, the charge voltage V11 across the capacitor C1 is output as the triangular-wave signal TRI. The second terminal of the resistor R1 and the first terminal of the resistor R2 correspond to an application terminal for a threshold voltage V12, and are both connected to the inverting input terminal (−) of the comparator CMP. The second terminals of the capacitor C1 and the resistor R2 are both connected to a ground terminal. The resistor R2 may be a variable resistor with a variable resistance value.

The first terminal of the resistor R3 is connected to the power supply terminal. The second terminal of the resistor R3 and the first terminal of the resistor R4 are both connected to the output terminal of the comparator CMP. The second terminal of the resistor R4 is connected to the base of the transistor Q1. The collector of the transistor Q1 is connected to the first terminal of the capacitor C1 (i.e., an application terminal for the charge voltage V11). The emitter of the transistor Q1 is connected to the ground terminal.

The current source CS generates a charge current Ic for the capacitor C1. The rise gradient of the division voltage V1 (hence the triangular-wave signal) is steeper the higher the charge current Ic, and is gentler the lower the charge current Ic.

The comparator CMP generates a comparison signal Sc by comparing the charge voltage V11, which is fed to the non-inverting input terminal (+) of the comparator CMP, with the threshold voltage V12, which is fed to the inverting input terminal (−) of the comparator CMP. Here, the comparison signal Sc is at low level when V11<V12, and is at high level when V11>V12.

The transistor Q1 functions a discharge switch that discharges the capacitor C1 according to the comparison signal Sc. In terms of what is shown in FIG. 23, the transistor Q1 is off when the comparison signal Sc is at low level, and is on when the comparison signal Sc is at high level.

For example, when the charge voltage V11 is lower than the threshold voltage V12, the comparison signal Sc is at low level, and thus the transistor Q1 is off. As a result, the capacitor C1 is charged by the charge current Ic, and the charge voltage V11 increases with a gradient commensurate with the charge current Ic.

As the capacitor C1 continues being charged, when the charge voltage V11 becomes higher than the threshold voltage V12, the comparison signal Sc turns to high level, and thus the transistor Q1 turns on. As a result, the capacitor C1 is discharged, and the charge voltage V11 falls sharply down to 0 V.

Thereafter, in a similar manner as described above, the capacitor C1 is repeatedly charged and discharged, and thereby the charge voltage V11 (hence the triangular-wave signal TRI) with a triangular waveform is generated.

However, depending on the voltage characteristics of the capacitor C1, the voltage dependence of its capacitance value (i.e., the factor of variation of the capacitance value with respect to the applied voltage) may be so high as to affect the generation of the triangular-wave signal TRI. For example, with a capacitor that employs a polysilicon layer as a conductive material, while it is inexpensive, applying a voltage to it causes widening of its depletion layer and hence a variation in its capacitance value; its capacitance value thus exhibits comparatively high dependence on voltage.

As a solution, as shown in a balloon in FIG. 23, the capacitor C1 is implemented with a first capacitor element C1A and a second capacitor element C1B connected in parallel such that terminals of different polarities are connected together between them. In terms of what is shown in the diagram, the negative terminal of the first capacitor element C1A and the positive terminal of the second capacitor element C1B are connected to a first wiring L1 (e.g., a wiring that connects to the application terminal for the charge voltage V11). On the other hand, the positive electrode of the first capacitor element C1A and the negative electrode of the second capacitor element C1B are connected to a second wiring L2 (e.g., a wiring connecting to the ground terminal). The technical significance of this configuration will now be described with reference to the relevant drawing.

Figure 24:
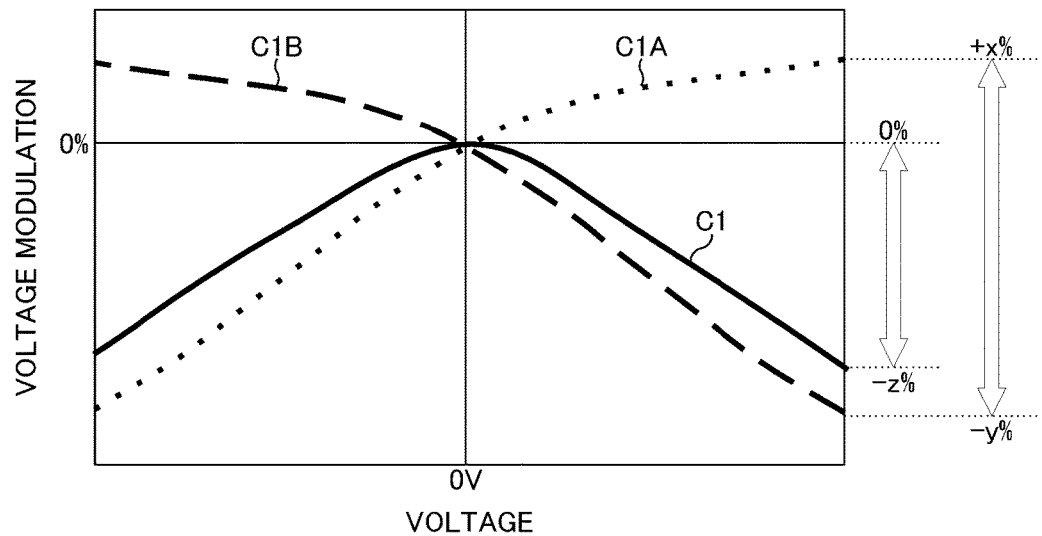
FIG. 24 is a diagram showing the voltage characteristics of a capacitor.

FIG. 24 is a diagram showing the voltage characteristics of the capacitor C1, with the horizontal axis representing the voltage applied to the capacitor C1 and the vertical axis representing the factor of variation of its capacitance value. In the diagram, a dotted line and a broken line represent the voltage characteristics of the first and second capacitors C1A and C1B respectively; a solid line represents the voltage characteristics of the capacitor C1 as a whole (the composite capacitance value of the first and second capacitors C1A and C1B).

As shown in the diagram, the first or second capacitor element C1A or C1B alone exhibits large variation (between +x % and −y %) of its capacitance value with respect to the applied voltage.

By contrast, with the capacitor C1 as a whole, owing to the first and second capacitors C1A and C1B being connected in parallel such that terminals of different polarities are connected together between them, the voltage characteristics of one cancel those of the other. This results in suppressed variation (between 0% and −z %, where z=|x−y|) of the capacitance value with respect to the applied voltage.

As described above, improving the voltage characteristics of the capacitor C1 allows accurate generation of the triangular-wave signal TRI, and hence allows transmission of the monitoring target signal S3 in a form accurately converted into the PWM signal s10.

<Capacitor Element Layout>

Figure 25:
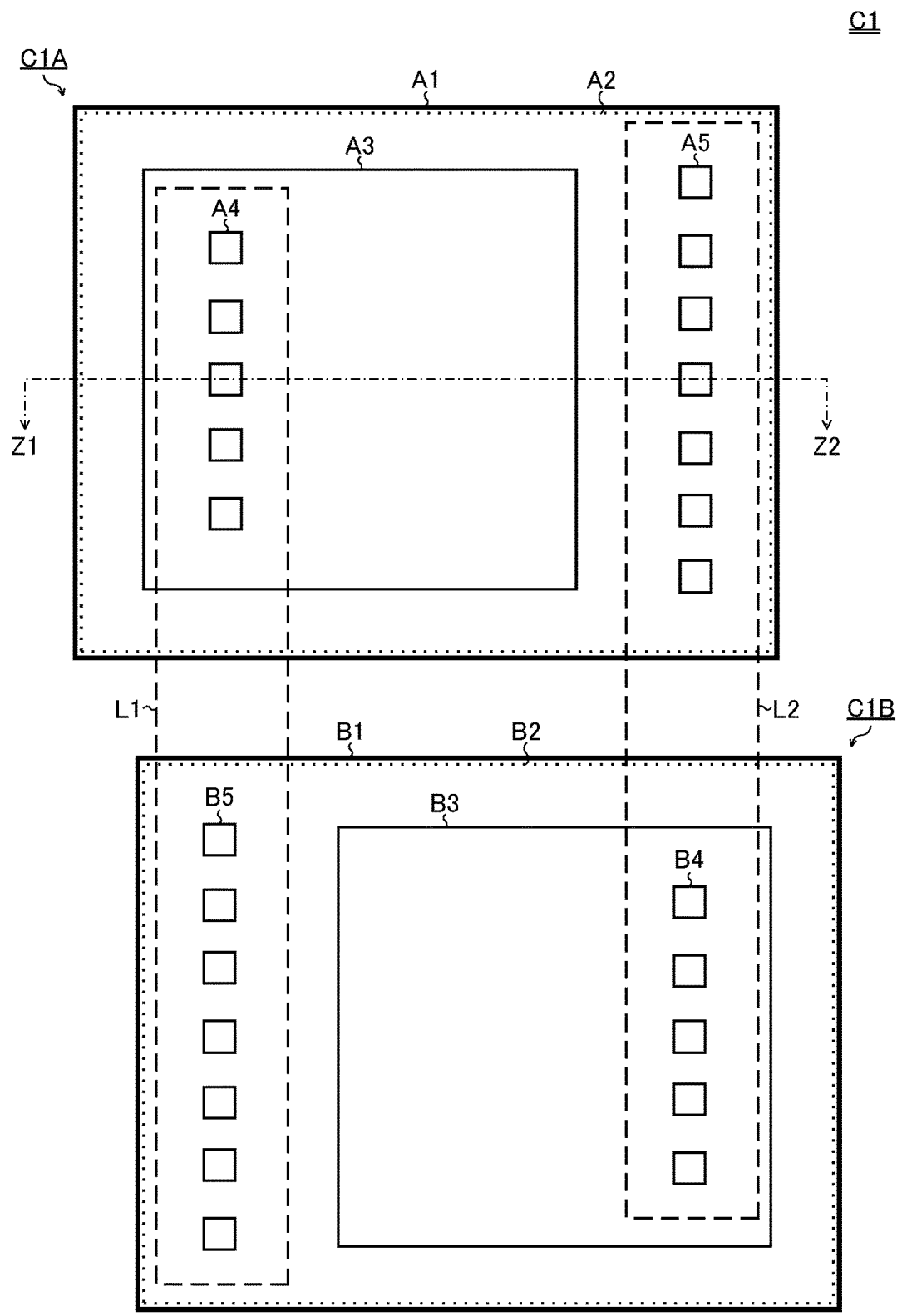
FIG. 25 is a diagram showing an element layout of a capacitor.
Figure 26:
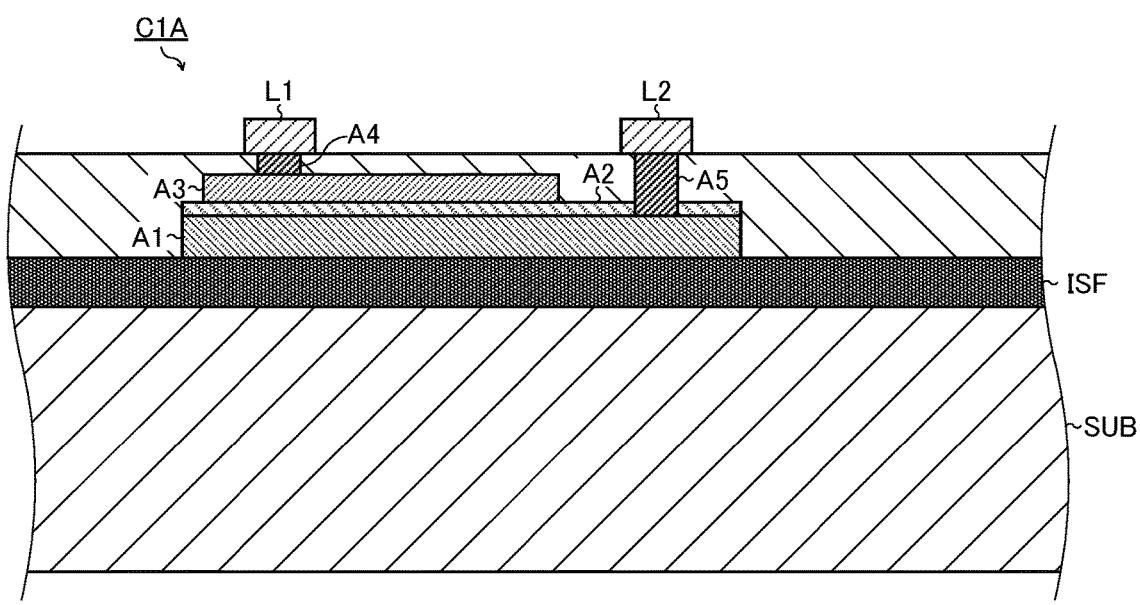
FIG. 26 is a vertical sectional view along line Z1-Z2.

FIG. 25 is a plan view of an example of the element layout of the capacitor C1, and FIG. 26 is a vertical sectional view along line Z1-Z2 in FIG. 25. As mentioned previously, the capacitor C1 is implemented with a first capacitor element C1A and a second capacitor element C1B connected in parallel such that terminals of different polarities are connected together between them.

The first capacitor element C1A is formed by stacking together, on top of an insulating film ISF formed on the surface of a substrate SUB (which may have an epitaxial layer formed in it), a first conductor A1, a first dielectric A2 formed on the first conductor A1, and a second conductor A3 formed on the first dielectric A2.

As seen in a plan view of the first capacitor element C1A, the second conductor A3 has a smaller area than either of the first conductor A1 and the first dielectric A2, and is stacked to overlap part of the first conductor A1 and part of the first dielectric A2. Accordingly, the area of the second conductor A3 is the effective area of the first capacitor element C1A.

Basically structured similarly to the first capacitor element C1A, the second capacitor element C1B is formed by stacking together a third conductor B1, a second dielectric B2 formed on the third conductor B1, and a fourth conductor B3 formed on the second dielectric B2.

As seen in a plan view of the second capacitor element C1B, the fourth conductor B3 has a smaller area than either of the third conductor B1 and the second dielectric B2, and is stacked to overlap part of the third conductor B1 and part of the second dielectric B2. Accordingly, the area of the fourth conductor B3 is the effective area of the second capacitor element C1B.

The first and second dielectrics A2 and B2 are formed, on the surfaces of the first and third conductors A1 and B1 respectively, up to (to reach, to be contiguous with) regions that are not covered by the second and fourth conductors A3 and B3.

The first and third conductors A1 and B1 are each a polysilicon layer. The first and second dielectrics A2 and B2 are each a silicon nitride layer. The second and fourth conductors A3 and B3 are each an aluminum layer. The materials specifically mentioned here are merely illustrative.

In the first capacitor element C1A, the second conductor A3 is connected, via a plurality of vias A4 formed on its surface, to the first wiring L1 (e.g., a wiring that connects to the application terminal for the charge voltage V11). On the other hand, the first conductor A1 has a region that is not covered by either the first dielectric A2 or the second conductor A3, and is connected, via a plurality of vias A5 formed in that region, to the second wiring L2 (e.g., a wiring that connects to the ground terminal). Thus, the second conductor A3 corresponds to the positive terminal of the first capacitor element C1A, and the first conductor A1 corresponds to the negative terminal of the first capacitor element C1A.

In the second capacitor element C1B, the fourth conductor B3 is connected, via a plurality of vias B4 formed on its surface, to the second wiring L2. On the other hand, the third conductor B1 has a region that is not covered by either the second dielectric B2 or the fourth conductor B3, and is connected, via a plurality of vias B5 formed in that region, to the first wiring L1. Thus, the third conductor B1 corresponds to the positive terminal of the second capacitor element C1B, and the fourth conductor B3 corresponds to the negative terminal of the second capacitor element C1B.

Incidentally, as shown in FIG. 25, the first and second capacitors C1A and C1B are arranged side by side in the top-bottom direction of the figure, with their planar structures reversed left to right. With this element layout, the plurality of vias A4 and B5 via which the second and third conductors A3 and B1 conduct to the first wiring L1 and the plurality of vias A5 and B4 via which the first and fourth conductors A1 and B3 conduct to the second wiring L2 can be disposed parallel to each other, with each plurality of vias arrayed along a straight line. This permits the first and second wirings L1 and L2 to be laid along straight lines parallel to each other, and helps increase the degree of integration of the capacitor C1.

<Application to Vehicles>

Figure 27:
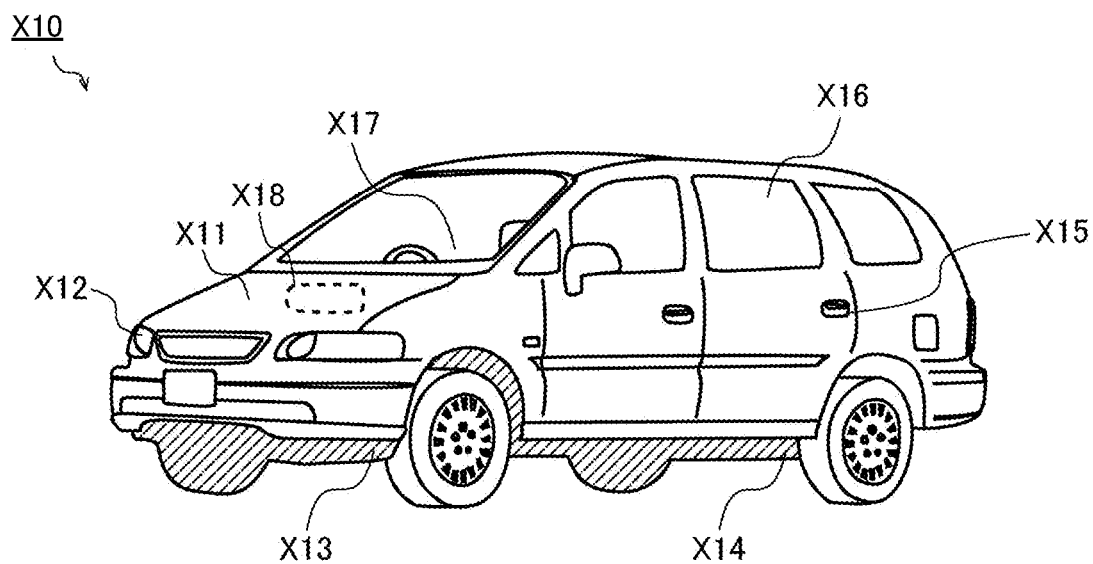
FIG. 27 is a diagram showing the exterior appearance of a vehicle that incorporates an electronic device.

FIG. 27 is a diagram showing the exterior appearance of a vehicle that incorporates an electronic device. The vehicle X10 of this configuration example incorporates various electronic devices X11 to X18 that operate by being supplied with electric power from an unillustrated battery. For the sake of convenience, in the diagram, the electronic devices X11 to X18 may be shown at places different from where they are actually arranged.

The electronic device X11 is an engine control unit that performs control with respect to an engine (injection control, electronic throttle control, idling control, oxygen sensor heater control, automatic cruise control, etc.).

The electronic device X12 is a lamp control unit that controls the lighting and extinguishing of HIDs (high-intensity discharged lamps), DRLs (daytime running lamps), or the like.

The electronic device X13 is a transmission control unit that performs control with respect to a transmission.

The electronic device X14 is a movement control unit that performs control with respect to the movement of the vehicle X10 (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X10 as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X10 optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The electronic devices X11 to X18 can be understood as specific examples of the electronic device A described previously. That is, either of the signal transmission devices 200 and 400 described previously can be built into any of the electronic devices X11 to X18.

<Overview>

To follow is an overview of the various embodiments described above.

For example, according to one aspect of what is disclosed herein, a signal transmission device includes a capacitor having a first capacitor element and a second capacitor element connected in parallel such that electrodes of different polarities are connected together between them, and transmits an analog signal in a form converted into a pulse signal by use of a triangular-wave signal generated through charging and discharging of the capacitor. (A first configuration.)

In the signal transmission device of the first configuration described above, the first capacitor element may be formed by stacking together: a first conductor; a first dielectric formed on the first conductor, and a second conductor formed on the first dielectric. The second capacitor element may be formed by stacking together: a third conductor; a second dielectric formed on the third conductor, and a fourth conductor formed on the second dielectric. The second and third conductors may be connected to a first wiring, and the first and fourth conductors may be connected to a second wiring. (A second configuration.)

In the signal transmission device of the second configuration described above, the first and second dielectrics may be formed, on the surfaces of the first and third conductors respectively, up to regions that are not covered by the second and fourth conductors. (A third configuration.)

In the signal transmission device of the third configuration described above, a plurality of vias via which the second and third conductors conduct to the first wiring and a plurality of vias via which the first and fourth conductors conduct to the second wiring may be disposed parallel to each other, with each plurality of vias arrayed along a straight line. (A fourth configuration.)

In the signal transmission device of any of the second to fourth configurations described above, the first and third conductors may both be polysilicon layers. (A fifth configuration.)

In the signal transmission device of any of the first to fifth configurations described above, the analog signal may be converted into the pulse signal by a pulse converter including: a triangular-wave oscillator configured to generate the triangular-wave signal; and a first comparator configured to generate the pulse signal by comparing the triangular-wave signal with the analog signal. (A sixth configuration.)

In the signal transmission device of the sixth configuration described above, the triangular-wave oscillator may include: a capacitor; a current source configured to generate a charge current for the capacitor; a second comparator configured to generate a comparison signal by comparing the charge voltage across the capacitor with a threshold voltage; and a discharge switch configured to discharge the capacitor according to the comparison signal. The triangular-wave oscillator may output the charge voltage as the triangular-wave signal. (A seventh configuration.)

The signal transmission device of any of the first to seventh configurations described above may include: a signal transmission circuit configured to transmit an input pulse signal to a primary circuit system as an output pulse signal from a secondary circuit system via a first isolating element; and a monitoring circuit configured to transmit the result of monitoring of a monitoring target signal in the secondary circuit system from the secondary circuit system to the primary circuit system via a second isolating element. The analog signal may correspond to the monitoring target signal, and the pulse signal may correspond to the result of the monitoring of the monitoring target signal. (An eighth configuration.)

In the signal transmission device of the eighth configuration described above, a first chip having integrated in it the circuit elements of the primary circuit system, a second chip having integrated in it the circuit elements of the secondary circuit system, and a third chip having integrated in it the first and second isolating elements may be sealed in a single package. (A ninth configuration.)

According to another aspect of what is disclosed herein, an electronic device includes: a power transistor; and a gate driver IC configured to drive the gate of the power transistor. Here, the gate driver IC is the signal transmission device of any of the first to ninth configurations described above. (A tenth configuration.)

According to yet another aspect of what is disclosed herein, a vehicle includes the electronic device of the tenth configuration described above. (An eleventh configuration.)

Other Modifications

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope and sense equivalent to those claims.

REFERENCE SIGNS LIST

1H(u/v/w) high-side gate driver IC
1L(u/v/w) low-side gate driver IC
2H(u/v/w) high-side power transistor
2L(u/v/w) low-side power transistor
3 ECU
4 motor
5H(u/v/w) resistor
5L(u/v/w) resistor
5 semiconductor device
11, 11A-11F low-potential terminal
12, 12A-12F high-potential terminal
21, 21A-21D transformer
22 low-potential coil (primary coil)
23 high-potential coil (secondary coil)
24 first inner end
25 first outer end
26 first spiral portion
27 second inner end
28 second outer end
29 second spiral portion
31 first low-potential wiring
32 second low-potential wiring
33 first high-potential wiring
34 second high-potential wiring
41 semiconductor chip
42 first principal surface
43 second principal surface
44A-44D chip side wall
45 first functional device
51 insulation layer
52 insulation principal surface
53A-53D insulation side wall
55 bottom insulation layer
56 top insulation layer
57 interlayer insulation layer
58 first insulation layer
59 second insulation layer
60 second functional device
61 sealing conductor
62 device region
63 outer region
64 sealing plug conductor
65 sealing via conductor
66 first inner region
67 second inner region
71 through wiring
72 low-potential connection wiring
73 lead wiring
74 first connection plug electrode
75 second connection plug electrode
76 pad plug electrode
77 substrate plug electrode
78 first electrode layer
79 second electrode layer
80 wiring plug electrode
81 high-potential connection wiring
82 pad plug electrode
85 dummy pattern
86 high-potential dummy pattern
87 first high-potential dummy pattern
88 second high-potential dummy pattern
89 first region
90 second region
91 third region
92 first connection part
93 first pattern
94 second pattern
95 third pattern
96 first outer circumferential line
97 second outer circumferential line
98 first middle line
99 first connection line
100 slit
130 separation structure
140 inorganic insulation layer
141 first inorganic insulation layer
142 second inorganic insulation layer
143 low-potential pad opening
144 high-potential pad opening
145 organic insulation layer
146 first part
147 second part
148 low-potential terminal opening
149 high-potential terminal opening
200 signal transmission device
200p primary circuit system
200s secondary circuit system
210 controller chip (first chip)
211 pulse transmission circuit (pulse generator)
212, 213 buffer
220 driver chip (second chip)
221, 222 buffer
223 pulse reception circuit (RS flip-flop)
224 driver
230 transformer chip (third chip)
230a first wiring layer (lower layer)
230b second wiring layer (upper layer)
231, 232 transformer
231p, 232p primary coil
231s, 232s secondary coil
300 transformer chip
301 first transformer
302 second transformer
303 third transformer
304 fourth transformer
305 first guard ring
306 second guard ring 400 signal transmission device (isolated gate driver IC)
400p primary circuit system
400s secondary circuit system
410 controller chip
420 driver chip
430 transformer chip
510 isolated signal transmission circuit
511 Schmitt buffer
512 pulse transmitter
513 pulse receiver
514 driver
515, 516 transformer
515p, 516p primary winding
515s, 516s secondary winding
520 isolated monitoring circuit
521 current source
522 switch
523 buffer
524 pulse converter
5241 triangular-wave oscillator
5242 comparator
525 pulse transmitter
526 pulse receiver
527, 528 transformer
527p, 528p primary winding
527s, 528s secondary winding
529 multiplexer
52A controller
a1-a8 pad (corresponding to first current feed pad)
b1-b8 pad (corresponding to first voltage measurement pad)
c1-c4 pad (corresponding to second current feed pad)
d1-d4 pad (corresponding to second voltage measurement pad)
e1, e2 pad
A electronic device
A1 first conductor (polysilicon layer)
A2 first dielectric (silicon nitride layer)
A3 second conductor (aluminum layer)
A4, A5 via
B1 third conductor (polysilicon layer)
B2 second dielectric (silicon nitride layer)
B3 fourth conductor (aluminum layer)
B4, B5 via
C1 capacitor
C1A first capacitor element
C1B second capacitor element
CMP comparator
CS current source
DP data pulse
GD0, GD1, GD2 signal transmission device
HP header pulse
ISF insulating film
L1 first wiring
L2 second wiring
L1p, L2p primary coil
L1s, L2s, L3s, L4s secondary coil
Q1 npn-type bipolar transistor
R1-R4 resistor
SUB substrate
TaD temperature sensor
T21, T22, T23, T24, T25, T26 external terminal
X10 vehicle
X11-X18 electronic devices
X first direction
X21, X22, X23 internal terminal
Y second direction
Y21, Y22, Y23 wiring
Z normal direction
Z21, Z22, Z23 via

The invention claimed is:

1. A signal transmission device comprising a capacitor having a first capacitor element and a second capacitor element connected in parallel such that electrodes of different polarities are connected together therebetween, the signal transmission device transmitting an analog signal in a form converted into a pulse signal by use of a triangular-wave signal generated through charging and discharging of the capacitor.

2. The signal transmission device according to claim 1, wherein
the first capacitor element is formed by stacking together:
a first conductor;
a first dielectric formed on the first conductor, and
a second conductor formed on the first dielectric,
the second capacitor element is formed by stacking together:
a third conductor;
a second dielectric formed on the third conductor, and
a fourth conductor formed on the second dielectric,
the second and third conductors are connected to a first wiring, and
the first and fourth conductors are connected to a second wiring.

3. The signal transmission device according to claim 2, wherein
the first and second dielectrics are formed, on surfaces of the first and third conductors respectively, up to regions that are not covered by the second and fourth conductors.

4. The signal transmission device according to claim 3, wherein
a plurality of vias via which the second and third conductors conduct to the first wiring and a plurality of vias via which the first and fourth conductors conduct to the second wiring are disposed parallel to each other, each plurality of vias being arrayed along a straight line.

5. The signal transmission device according to claim 2, wherein
the first and third conductors are each a polysilicon layer.

6. The signal transmission device according to claim 1, wherein
the analog signal is converted into the pulse signal by a pulse converter including:
a triangular-wave oscillator configured to generate the triangular-wave signal; and
a first comparator configured to generate the pulse signal by comparing the triangular-wave signal with the analog signal.

7. The signal transmission device according to claim 6, wherein
the triangular-wave oscillator includes:
a capacitor;
a current source configured to generate a charge current for the capacitor;
a second comparator configured to generate a comparison signal by comparing a charge voltage across the capacitor with a threshold voltage; and
a discharge switch configured to discharge the capacitor according to the comparison signal, and
the triangular-wave oscillator outputs the charge voltage as the triangular-wave signal.

8. The signal transmission device according to claim 1, further comprising:

a signal transmission circuit configured to transmit an input pulse signal to a primary circuit system as an output pulse signal from a secondary circuit system via a first isolating element; and a monitoring circuit configured to transmit a result of monitoring of a monitoring target signal in the secondary circuit system from the secondary circuit system to the primary circuit system via a second isolating element, wherein the analog signal corresponds to the monitoring target signal, and the pulse signal corresponds to the result of the monitoring of the monitoring target signal.

9. The signal transmission device according to claim 8, wherein a first chip having integrated therein circuit elements of the primary circuit system, a second chip having integrated therein circuit elements of the secondary circuit system, and a third chip having integrated therein the first and second isolating elements are sealed in a single package.

10. An electronic device comprising:

a power transistor; and a gate driver IC configured to drive a gate of the power transistor, wherein the gate driver IC is the signal transmission device according to claim 1.

11. A vehicle comprising the electronic device according to claim 10.

* * * * *